US007999312B2

(12) United States Patent
Takaya et al.

(10) Patent No.: US 7,999,312 B2
(45) Date of Patent: Aug. 16, 2011

(54) INSULATED GATE-TYPE SEMICONDUCTOR DEVICE HAVING A LOW CONCENTRATION DIFFUSION REGION

(75) Inventors: Hidefumi Takaya, Nishikamo-gun (JP); Kimimori Hamada, Toyota (JP); Kyosuke Miyagi, Nishikamo-gun (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 343 days.

(21) Appl. No.: 12/223,871

(22) PCT Filed: Jan. 26, 2007

(86) PCT No.: PCT/JP2007/051744
§ 371 (c)(1),
(2), (4) Date: Aug. 12, 2008

(87) PCT Pub. No.: WO2007/105384
PCT Pub. Date: Sep. 20, 2007

(65) Prior Publication Data
US 2010/0224932 A1    Sep. 9, 2010

(30) Foreign Application Priority Data
Mar. 8, 2006    (JP) ................................ 2006-062602

(51) Int. Cl.
*H01L 29/66* (2006.01)
*H01L 29/732* (2006.01)
*H01L 29/78* (2006.01)
*H01L 21/426* (2006.01)

(52) U.S. Cl. ........ 257/331; 257/330; 257/332; 257/341; 257/492; 257/493; 257/E29.257; 438/524; 438/525; 438/526; 438/527

(58) Field of Classification Search ........... 257/330–334
See application file for complete search history.

(56) References Cited

U.S. PATENT DOCUMENTS
2004/0195618 A1*  10/2004  Saito et al. ................ 257/330
(Continued)

FOREIGN PATENT DOCUMENTS
EP         0 893 830 A1      1/1999
(Continued)

OTHER PUBLICATIONS

Ono, et al.: *30V New Fine Trench MOSFET with Ultra Low On-Resistance*, 2003 IEEE 15$^{TH}$ International Symposium on Power Semiconductor Devices and IC's Proceedings, Cambridge, UK, Apr. 14-17, 2003, International Symposium on power semiconductor Devices & IC's, New York, NY: IEEE, US, Apr. 14, 2003, pp. 28-31, XP010653693 ISBN:0-7803-7876-8.

(Continued)

*Primary Examiner* — Ha Tran T Nguyen
*Assistant Examiner* — Raj R Gupta
(74) *Attorney, Agent, or Firm* — Kenyon & Kenyon LLP

(57) ABSTRACT

A semiconductor 100 has a P$^-$ body region and an N$^-$ drift region in the order from an upper surface side thereof. A gate trench and a terminal trench passing through the P$^-$ body region are formed. The respective trenches are surrounded with P diffusion regions at the bottom thereof. The gate trench builds a gate electrode therein. A P$^{--}$ diffusion region, which is in contact with the end portion in a lengthwise direction of the gate trench and is lower in concentration than the P$^-$ body region and the P diffusion region, is formed. The P$^{--}$ diffusion region is depleted prior to the P diffusion region when the gate voltage is off. The P$^{--}$ diffusion region serves as a hole supply path to the P diffusion region when the gate voltage is on.

12 Claims, 20 Drawing Sheets

U.S. PATENT DOCUMENTS

| | | | |
|---|---|---|---|
| 2006/0289928 A1* | 12/2006 | Takaya et al. | 257/330 |
| 2007/0241394 A1* | 10/2007 | Takaya et al. | 257/330 |

FOREIGN PATENT DOCUMENTS

| | | | |
|---|---|---|---|
| EP | 1 557 888 A1 | | 7/2005 |
| JP | 04-014841 | | 1/1992 |
| JP | 05-110072 | | 4/1993 |
| JP | 07-273121 | | 10/1995 |
| JP | 09-191109 | | 7/1997 |
| JP | 2002-511657 A | | 4/2002 |
| JP | 2005-116822 A | | 4/2005 |
| JP | 2005116822 A | * | 4/2005 |
| JP | 2005-142243 A | | 6/2005 |
| JP | 2005327762 A | * | 11/2005 |
| WO | 2005/036650 A1 | | 4/2005 |

OTHER PUBLICATIONS

Takaya et al.: *Floating Island and Thick Bottom Oxide Trench Gate MOSFET (FITMOS)—A 60V Ultra Low on Resistance Novel MOSFET with Superior Internal Body Diode-*; Proceedings of the 17$^{th}$ International Symposium on Power Semiconductor Devices & IC's, May 23-26, 2005, Santa Barbara, CA, pp. 43-46, ISPSD2005.

* cited by examiner

FIELD INTENSITY
A-A

FIG. 22

| | SINGLE LAYER | | TWO LAYERS | | THREE LAYERS | | RESISTANCE INCREASING RATE |
|---|---|---|---|---|---|---|---|
| | CONCENTRATION | THICKNESS | CONCENTRATION | THICKNESS | CONCENTRATION | THICKNESS | |
| SINGLE-LAYERED STRUCTURE | 2E16/cm³ | 7.5μm | | | | | 120% |
| DOUBLE-LAYERED STRUCTURE | 0.5E16/cm³ | 1.3μm | 3E16/cm³ | 6.2μm | | | 50% |
| THREE-LAYERED STRUCTURE | 0.3E16/cm³ | 1.3μm | 0.3E16/cm³~3E16/cm³ | 1.5μm | 3E16/cm³ | 4.7μm | 40% |

FIELD INTENSITY
A-A

INSULATED GATE-TYPE SEMICONDUCTOR DEVICE HAVING A LOW CONCENTRATION DIFFUSION REGION

This is a 371 national phase application of PCT/JP2007/051744 filed 26 Jan. 2007, claiming priority to Japanese Patent Application No. 2006-062602 filed 8 Mar. 2006, the contents of which are incorporated herein by reference.

TECHNICAL FIELD

The present invention relates to an insulated gate-type semiconductor device of a trench gate structure and also to a manufacturing method thereof. More particularly, the present invention relates to an insulated gate-type semiconductor with improved on-resistance characteristics, in which a drift region includes a diffusion layer of a conductive type different from that of the drift region to mitigate an electric field exerted on a drift layer.

BACKGROUND ART

Conventionally, trench gate-type semiconductor devices having a trench gate structure have been hitherto proposed as an insulated gate-type semiconductor device for power device applications. With this type of trench gate-type semiconductor device, high withstand voltage and low on-resistance are generally in trade-off relation.

For a trench gate-type semiconductor device designed to focus attention on the above problem, the present applicant proposed an insulated gate-type semiconductor device as shown in FIG. 24 (see JP-A-2005-142243). This insulated gate-type semiconductor device 900 is provided with an N$^+$ source region 31, an N$^+$ drain region 11, a P$^-$ body region 41 and an N$^-$ drift region 12. A semiconductor substrate is engraved partly at an upper surface side thereof to form a gate trench 21 passing through the P$^-$ body region 41. A deposited insulating layer 23 obtained by deposition of an insulator is formed on the bottom of the gate trench 21. Moreover, a gate electrode 22 is formed on the deposited insulating layer 23. The gate electrode 22 faces to the N$^+$ source region 31 and P$^-$ body region 41 through a gate insulating film 24 formed on the wall surfaces of the gate trench 21. A P diffusion region 51 in a floating state is formed inside the drift region 12. The lower end of the gate trench 21 is positioned within the P diffusion region 51.

The insulated gate-type semiconductor device 900 has the following characteristics owing to the provision of the P diffusion region 51 in a floating state within the N$^-$ drift region 12 (which structure is hereinafter referred to as a "floating structure").

With this insulated gate-type semiconductor device 900, when the gate voltage is off, a depletion layer spreads from a PN junction between the N$^-$ drift region 12 and the P$^-$ body region 41. On arrival of the depletion layer at the P diffusion region 51, the P diffusion region 51 is turned into a punchthough condition, thereby fixing a potential. Moreover, because the depletion layer also spreads from a PN junction with the P diffusion region 51, a peak of field intensity is formed at the PN junction with the P diffusion region 51, aside from the PN junction with the P$^-$ body region 41. More particularly, as shown in FIG. 25, two peaks of field intensity are formed, thereby enabling a maximum peak to be reduced. Thus, high withstand voltage is realized. Because of the high withstand voltage, it becomes possible to achieve a low on-resistance by increasing an impurity concentration of the N$^-$ drift region 12. It will be noted that the mechanism of the floating structure is disclosed in detail, for example, in JP-A-9 (1997)-191109.

With an insulated gate-type semiconductor device for inverter circuit, it is usual that when a gate voltage (Vg) is turned on or off, a drain voltage (Vd) changes as indicated by the solid line of FIG. 26. More particularly, when Vg is turned on (A in FIG. 26), a depletion layer does not spread, thus permitting operation to be in a low on-resistance state. During the course where Vg is off (B in FIG. 26), the depletion layer is in a spread state (in a state of high on-resistance), under which Vd becomes high. More particularly, the withstand voltage between the drain and source is ensured by means of the depletion layer. When Vg is turned on again (C in FIG. 26), the depletion layer becomes narrowed again. This results in operation in a low on-resistance state.

However, the insulated gate-type semiconductor device having such a floating structure as set out hereinabove is more unlikely to return to the low on-resistance state when stayed at C in FIG. 26 in comparison with an ordinary insulated gate-type semiconductor device. That is, with an insulated gate-type semiconductor device having no floating structure (an ordinary insulated gate-type semiconductor device), holes are supplied from the source, so that the depletion layer is instantaneously narrowed. On the other hand, with the insulated gate-type semiconductor device having such a floating structure as shown in FIG. 24, the P diffusion region beneath the trench is in a floating state where holes are not sufficiently supplied. Accordingly, it takes a long time before the depletion layer that has spread to below the P diffusion region beneath the trench is narrowed. As a consequence, as indicated by the dotted line in FIG. 26, instantaneous return to the low on-resistance state is not realized. Thus, an adverse influence on the on-resistance characteristic is given.

Especially, with a large chip size, holes to be supplied become great in quantity. In other words, as the chip size increases, a delay is caused in supply of holes. Thus, there is concern that a switching performance degrades.

The invention has been accomplished to solve the problems involved in the afore-stated prior art insulated gate-type semiconductor devices. More particularly, an object of the invention is to provide an insulated gate-type semiconductor device, and a manufacturing method thereof, which is high in withstand voltage and wherein a good on-resistance characteristic is obtained at the time of switching operation.

DISCLOSURE OF THE INVENTION

To achieve the above object, the present invention provides an insulated gate-type semiconductor device having a body region which is located at an upper surface side within a semiconductor substrate and is a semiconductor of a first conductive type, and a drift region which is in contact with a lower face of the body region and is a semiconductor of a second conductive type, characterized by comprising: a trench passing from an upper surface of the semiconductor substrate through the body region; a gate insulating film positioned at a side wall of the trench; a gate electrode located inside the trench facing to the body region through the gate insulating film; a buried diffusion region which is positioned below the gate electrode, is surrounded with the drift region and surrounds a bottom of the trench therewith, and is a semiconductor of the first conductive type; and a low concentration diffusion region which is in juncture with the body region and the buried diffusion region, is lower in concentration than the buried diffusion region, and is a semiconductor of the first conductive type.

An insulated gate-type semiconductor device of the invention has a trench gate structure in which a gate electrode is built in a trench. The drift region is provided therein with a buried diffusion region, which is formed of a semiconductor of a conductive type differing in type from the drift region, and the bottom of the trench is positioned within the buried diffusion region. Moreover, there is provided, between a body region and the buried diffusion region, a low concentration diffusion layer that is a semiconductor of the same conductive type as both regions, is connected with both regions, and has a concentration lower than the buried diffusion region. The low concentration diffusion region becomes a region, which is very low in concentration and ultrahigh in resistance due to the depletion layer spreading from the PN junction with the drift region. In this way, the buried diffusion region becomes a floating state at the off time of gate voltage. For this reason, a withstand voltage structure similar to the floating structure is realized to ensure a high withstand voltage.

It will be noted that for providing such a withstand voltage structure similar to a floating structure, the buried diffusion layer is so disposed that a field peak appears at two portions including the PN junction between the body region and the drift region and the PN junction between the buried diffusion region and the drift region. Preferably, the disposition is such that their peak values are equal to each other.

In particular, the low concentration diffusion region has such a concentration and width as to permit at least a part of the region along the thickness thereof to be depleted prior to the buried diffusion region when the gate voltage is off. When the low concentration diffusion region is depleted, substantially the same withstand voltage characteristic as that of a conventional semiconductor device (FIG. 24) which has been formed with a floating structure beforehand is obtained. Preferably, the concentration and width of the low concentration diffusion region are so set that a RESURF relationship is obtained.

On the other hand, after spreading of the depletion layer, when the gate voltage is on, the depletion layer is narrowed, thus turning into a low on-resistance state. At that time, carriers are supplied to the buried diffusion region via the low concentration diffusion region. This enables the depletion layer spreading from the buried diffusion region to be narrowed rapidly. Hence, a good on-resistance characteristic is obtained.

The low concentration diffusion region of the insulated gate-type semiconductor device of the invention should preferably be in contact with a side face of an end portion of the trench in a lengthwise direction as viewed from above (a lengthwise direction of the trench in a state as viewed from the above of the semiconductor substrate, which is hereinafter referred to simply as a "lengthwise direction"). In other words, since the low concentration diffusion region is located at the side face of the trench, it can be formed by inclined ion implantation. Because of the location at the end portion of the trench, an incident angle at the time of inclined ion implantation can be made large. This enables reflection or the like to be reduced, and the concentration and size of the diffusion region can be strictly controlled. The low concentration diffusion region is in contact with the side face of the end portion, so that a channel resistance does not increase and little influence is given on on-resistance.

The low concentration diffusion region of the insulated gate-type semiconductor device of the invention may be in contact with one of side faces of the trench as viewed from the section intersecting with the lengthwise direction of the trench. More particularly, since the low concentration diffusion region is located at the side face in the lengthwise direction of the trench, it is easy to manufacture. In addition, the low concentration diffusion region is in contact with one side face, so that the other side face is in a state of low resistance. Hence, the on-resistance is prevented from increasing. In this case, it is preferred that a concentration in an epitaxial layer at a region of a junction between the low concentration diffusion region and the body region is higher than the other regions of the epitaxial layer. If the region of the junction portion is made high in concentration, a channel current is likely to flow. In this way, an increase of on-resistance can be suppressed.

The trench of the insulated gate-type semiconductor device of the invention is preferred that it has such a layout as to be divided into a plurality of sub-trenches in the lengthwise direction, and the low concentration diffusion region is in contact with individual end portions of the sub-trenches. More particularly, the layout where the trench is divided allows the end portions of the trench to be increased in number, with which the low concentration diffusion regions are disposed at individual end portions. In this manner, a number of low concentration diffusions regions can be arranged, so that in case where a chip size is large, a good on-resistance characteristic is obtained. In other words, a hole supply path can be shortened, thereby further improving a supply speed. Moreover, a supply path of holes can be formed at the central portion of a cell area, so that holes can be supplied substantially uniformly throughout the cell area.

The layout of the sub-trenches may include, for example, a layout in which adjacent sub-trenches are arranged with respective end portions in the lengthwise direction aligned with each other and another layout in which adjacent sub-trenches are arranged with respective end portions in the lengthwise direction differing from each other.

According to another aspect, the present invention provides a manufacturing method of an insulated gate-type semiconductor device which has a body region positioned at an upper surface side within a semiconductor substrate and is a semiconductor of a first conductive type, and a drift region contacting with a lower portion of the body region and is a semiconductor of a second conductive type, characterized by comprising: a trench forming step of forming a mask pattern for forming a trench positioned within a cell region and forming a trench passing through the body region by etching based on the mask pattern; and an impurity implanting step of implanting an impurity toward a bottom of the trench to form a buried diffusion region of the first conductive type and implant the impurity from an inclined direction along a lengthwise direction as viewed from above the trench and also to form a low concentration diffusion region which is in juncture with the buried diffusion region and the body region and which is lower in concentration than the buried diffusion region and is a semiconductor of the first conductive type.

In accordance with the manufacturing method of the invention, after formation of the trench in the trench-forming step, an impurity is implanted from the bottom and side faces of the trench in the impurity implanting step to form individual diffusion regions. More particularly, a buried diffusion region is formed by ion implantation into the bottom face of the trench and a low concentration diffusion region whose concentration is lower than the buried diffusion region is formed at a side of the end portion of the trench by inclined ion implantation along the lengthwise direction of the trench.

In the manufacturing method of the invention, an impurity can be implanted to a deep position of the trench by inclined ion implantation along the lengthwise direction even if the implantation angle is made great. Since the implantation angle is great, reflection at the side face is lessened, thereby ensuring stable manufacture. Especially, this is effective for the formation of the low concentration diffusion region wherein it is necessary to accurately control the concentration and size.

According to another aspect, further, the present invention provides, an insulated gate-type semiconductor device which comprises a body region positioned at an upper surface side within a semiconductor substrate and is a semiconductor of a first conductive type, and a drift region contacting with a lower face of the body region and is a semiconductor of a second conductive type, characterized by comprising: a trench passing through from an upper face of the semiconductor substrate to the body region; a gate insulating film disposed on side walls of the trench; a gate electrode located inside the trench and facing to the body region through the gate insulating film; and a floating diffusion region which is positioned below the gate electrode, is surrounded with the drift region and surrounds a bottom of the trench, and is of a semiconductor of the first conductive type and is electrically in a floating state, wherein the drift region includes a low concentration region in contact with a lower face of the body region and a high concentration region located below the low concentration region, and the floating diffusion region is positioned, at a lower end thereof, above a lower face of the high concentration region.

Another insulated gate-type semiconductor device of the invention has a trench gate structure in which a gate electrode is built in a trench. A drift region is provided therein with a floating diffusion region that is a semiconductor of a conductive type different from the drift region, and the bottom of the trench is located within the floating diffusion region. The floating diffusion region is disposed at such a position that a field peak can be formed at two portions including a PN junction between a body region and the drift region and a PN junction between the floating diffusion region and the drift region. Preferably, the disposition is such that the peak values are equal to each other. That is, this insulated gate-type semiconductor device has a floating structure.

The drift region has a low concentration region kept in contact with the body region and a high concentration region disposed below the low concentration region. The lower face of the high concentration region is positioned below the lower end of the floating diffusion region. Hence, with another insulated gate-type semiconductor device of the invention, a depletion layer is unlikely to spread below the floating diffusion region when the gate voltage is off. As a result, since the depletion layer does not originally spread over a wide range at the time of the gate voltage being off, the drift current is not impeded when the gate voltage is turned on. Accordingly, a good on-resistance characteristic is obtained. Moreover, a low concentration region is provided between the high concentration region and the body region. In doing so, a withstand voltage can be held by means of a depletion layer spreading mainly from the lower face of the body region, thereby suppressing a lowering of withstand voltage.

The drift region of another insulated gate-type semiconductor device of the invention has, between the low concentration region and the high concentration region, an inclined concentration region where the concentration gently changes from the concentration in the low concentration region to the concentration in the high concentration region in a direction of thickness, and the position of the interface between the high concentration region and the low concentration region along a thickness thereof is preferably intermediate between the lower end and the upper end of the floating diffusion region. More particularly, when the inclined concentration region is provided wherein the concentration gently changes between the low concentration region and the high concentration region, a depletion layer spreading from the body region can be reliably extended to the floating diffusion region. Accordingly, the lowering of withstand voltage can be more reliably suppressed.

BRIEF DESCRIPTION OF DRAWINGS

FIG. 22 is a table showing the results of simulation of the insulated gate-type semiconductor device shown in FIG. 19;

BEST MODE FOR CARRYING OUT THE INVENTION

Embodiments of the invention will be described below in detail with reference to the accompanying drawings. In the following embodiments, the present invention is applied to power MOS of controlling conduction between the drain and source by application of a voltage to an insulating gate.

First Embodiment

An insulated gate-type semiconductor device 100 (hereinafter referred to as "semiconductor device 100") according to the first embodiment has such a structure as shown in the plan perspective view of FIG. 1 and the sectional view of FIG. 2. It will be noted that in the present specification, an entirety, in combination, of a starting substrate and a single crystal silicon portion formed by epitaxial growth on the starting substrate is called semiconductor substrate.

The semiconductor device 100 of this embodiment is constituted of a cell area (an area within a broken line frame x in FIG. 1) and a terminal area (an area outside of the broken line frame x in FIG. 1) surrounding the cell area. More particularly, the cell area of the semiconductor device 100 is partitioned with a terminal area. A plurality of gate trenches 21 are provided within the cell area and three terminal trenches 62 are provided within the terminal area.

Particularly, the gate trenches 21 and the terminal trenches 62 are, respectively, disposed in the form of stripes and in the form of a circle surrounding the cell area. It will be noted that the gate trenches 21 are formed at pitches of about 2.5 μm. The terminal trenches 62 are formed at pitches of about 2.0 μm.

Figure 1:
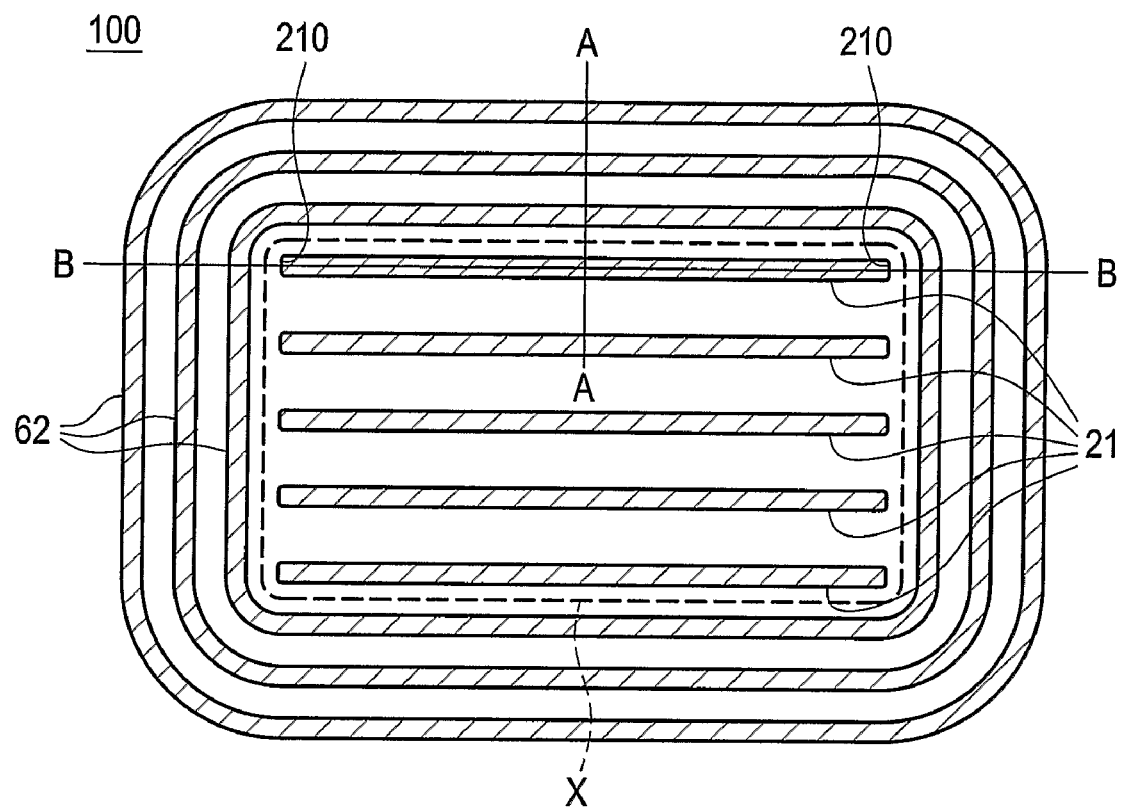
FIG. 1 is a plan view showing a structure of an insulated gate-type semiconductor device according to a first embodiment.
Figure 2:
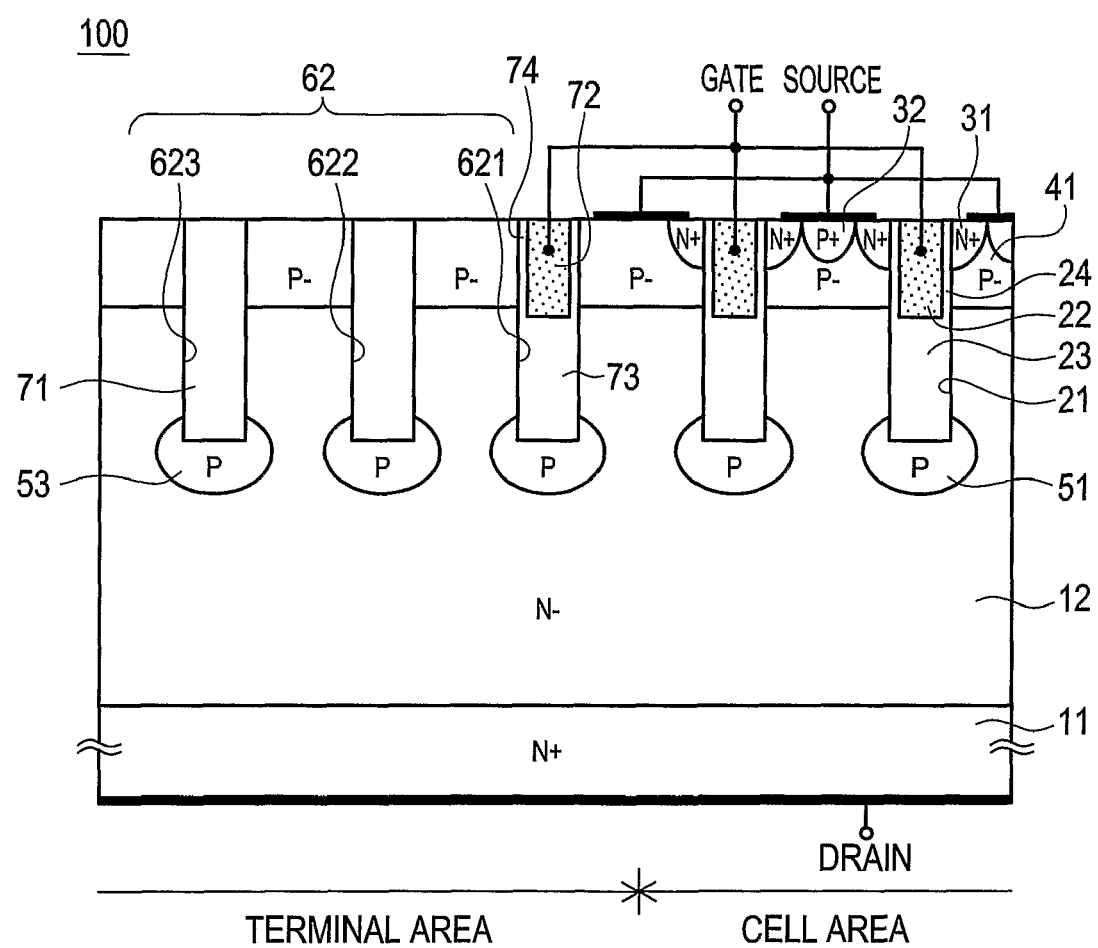
FIG. 2 is a view showing an A-A section of the insulated gate-type semiconductor device shown in FIG. 1.

FIG. 2 is a view showing an A-A section of the semiconductor device 100 shown in FIG. 1. The cell area of the semiconductor device 100 is provided with a source electrode at an upper surface side of the semiconductor substrate and a drain electrode at a lower surface side in FIG. 2, respectively. The semiconductor substrate is provided therein with an $N^+$ source region 31 and a contact $P^+$ region 32 at the upper surface side thereof and also with an $N^+$ drain region 11 at the lower surface side. A $P^-$ body region 41 (concentration: $1.0 \times 10^{17}/cm^3 - 2.0 \times 10^{17}/cm^3$) and an $N^-$ drift region 12 (concentration: about $2.5 \times 10^{16}/cm^3$) are provided between the $N^+$ source region 31 and the $N^+$ drain region 11 in the order from the upper surface side.

Part of the semiconductor substrate is engraved at the upper surface side thereof to form the gate trenches 21. Individual trenches pass through the $P^-$ body region 41. The depth of the gate trench 21 is at about 2.5 μm, and the depth of the $P^-$ body region 41 is at about 1.0 μm.

The gate trench 21 is formed at the bottom thereof with a deposited insulating layer 23 formed by deposition of an insulator. More particularly, the deposited insulating layer 23 of this embodiment is one formed by deposition of silicon oxide at the bottom of the gate trench 21. A gate electrode 22 is formed on the deposited insulating layer 23. The lower end of the gate electrode 22 is positioned below the lower face of the $P^-$ body region 41. The gate electrode 22 is facing to the $N^+$ source region 31 and the $P^-$ body region 41 of the semiconductor substrate through a gate insulating film 24 formed on the wall surfaces of the gate trench 21. That is, the gate electrode 22 is insulated from the $N^+$ source region 31 and the $P^-$ body region 41 by means of the gate insulating film 24.

With the semiconductor device 100 having such a structure as set out above, a channel effect is caused in the $P^-$ body region 41 by application of a voltage to the gate electrode 22, thereby controlling conduction between the $N^+$ source region 31 and the $N^+$ drain region 11.

The terminal area of the semiconductor device 100 is provided with three terminal trenches 62 (hereinafter referred to as "terminal trench 621", "terminal trench 622" and "terminal trench 623" in the order closer to the cell area, respectively). The inside of the terminal trench 621 is such that a terminal gate region 72 is disposed on a deposited insulating layer 73, like the inside of the gate trench 21. The terminal gate region 72 is electrically connected with the gate electrode 22 and becomes the same potential as the gate electrode 22. Owing to the presence of the terminal gate region 72, extension of a depletion layer spreading from the PN junction portion with the lower face of the $P^-$ body region 41 is facilitated. Moreover, the terminal gate region 72 faces to the $P^-$ body region 41 through a gate insulating film 74 formed on wall surfaces of the terminal trench 621. On the other hand, the terminal trenches 622, 623 are each filled with a deposited insulating layer 71 (i.e. a gateless structure).

The semiconductor device 100 is formed, around the bottom of the gate trench 21, with a P diffusion region 51 (concentration: about $1.0 \times 10^{17}/cm^3 - 2.0 \times 10^{17}/cm^3$) surrounded with the $N^-$ drift region 12. A P diffusion region 53 surrounded with the $N^-$ drift region 12 is formed around the bottom of the terminal trench 62. It will be noted that the P diffusion region 51 and the P diffusion region 53 are those regions that are, respectively, formed by implanting an impurity from the bottom face of the gate trench 21 and the bottom face of the terminal trench 62. The manufacturing method of the semiconductor device 100 will be described hereinafter. The sections of the respective P diffusion regions are substantially in a circular form about the bottom of each trench.

It should be noted that adjacent P diffusion regions 51, 51 have therebetween a space enough to allow movement of carriers. Accordingly, in the state where the gate voltage is on, the presence of the P diffusion region 51 will not interfere with drain current. On the other hand, the space between the adjacent P diffusion regions 53, 53 is smaller than the space between the P diffusion regions 51, 51. However, because no drift current runs in the terminal area, to achieve a low on-resistance is not impeded.

The number of the terminal trenches is not limited to three. So far as it is possible to keep a withstand voltage, the number of the terminal trenches 62 may be set at 2 (minimum number). If a difficulty is involved in keeping the withstand voltage by use of three trenches, the number of terminal trenches 62 may be four or more. In either case, the terminal gate region 72 is provided within the innermost terminal trench 621, like the gate trench 21.

Figure 3:
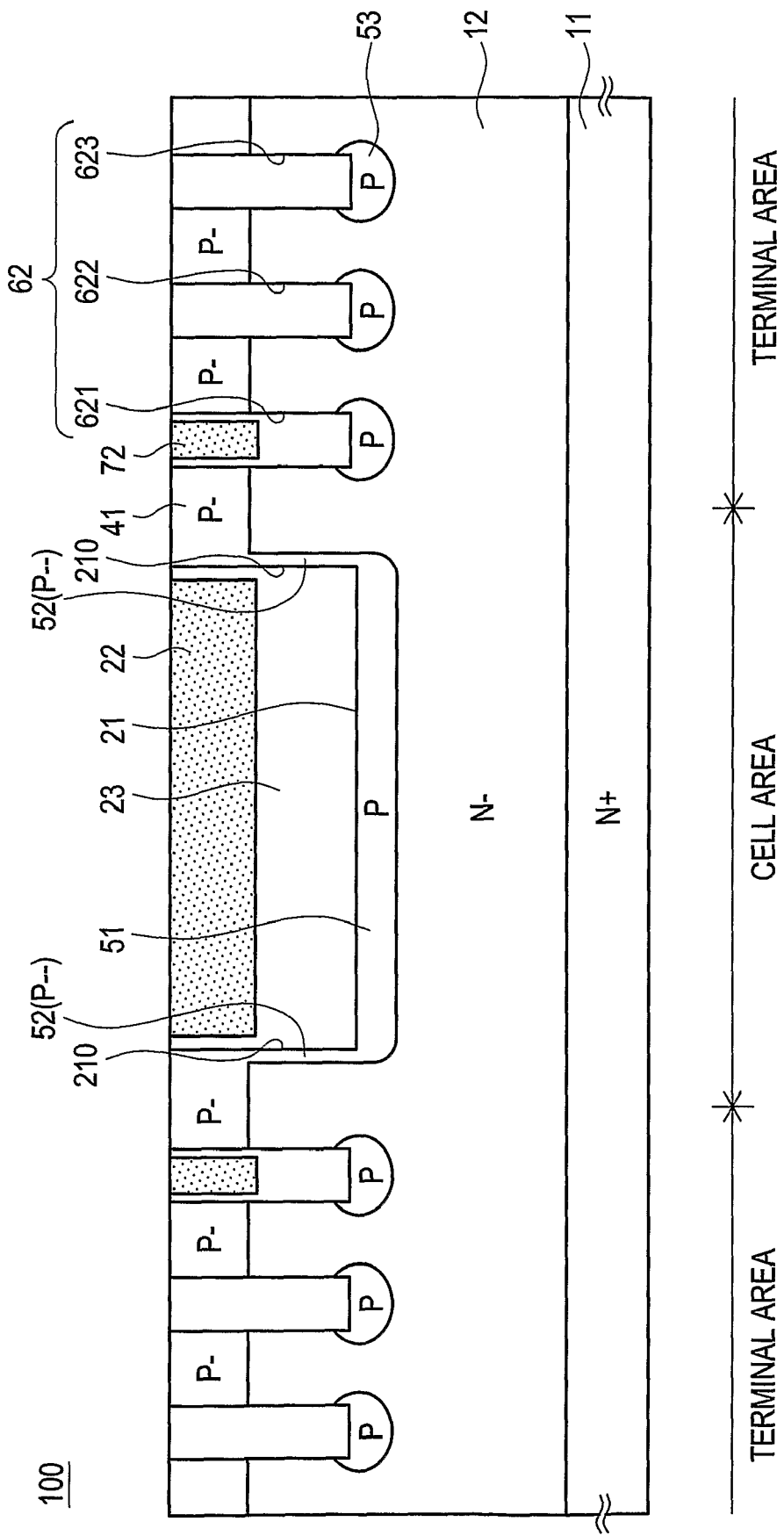
FIG. 3 is a view showing a B-B section of the insulated gate-type semiconductor device shown in FIG. 1.

FIG. 3 is a view showing a B-B section of the semiconductor device 100 shown in FIG. 1. With the semiconductor device 100, a P$^{--}$ diffusion region 52 surrounded with the N$^-$ drift region 12 is formed around an end portion 210 of the gate trench 21 in a lengthwise direction. It will be noted that the term "lengthwise direction" used herein means a lengthwise direction of gate trench as viewed from the above of the semiconductor substrate. More particularly, this direction differs from a direction of depth of the gate trench (i.e. a direction of thickness of the semiconductor substrate). The P$^{--}$ diffusion region 52 is connected with the P$^-$ body region 41 at the upper end thereof and also with the P diffusion region 51 at the lower end. The P$^{--}$ diffusion region 52 is a region whose concentration is lower than the P$^-$ body region 41 and the P-diffusion region 51. It will be noted that the P$^{--}$ diffusion region 52 is one formed by implanting an impurity from the side face of the end portion 210 of the gate trench 21. The method of manufacturing the semiconductor device 100 will be described in detail hereinafter.

The P$^{--}$ diffusion region 52 is a region that is in juncture with the P$^-$ body region 41 and the P diffusion region 51. Accordingly, when a gate voltage Vg is turned on in a state where the depletion layer spreads within the N$^-$ drift region 12, holes are supplied to the P diffusion region 51 through the P$^{--}$ diffusion region 52.

The P$^{--}$ diffusion region 52 is designed at such a concentration and width (thickness in a lateral direction) as to be depleted at the time of the gate voltage Vg being off. Particularly, in this embodiment, the peak concentration is at about 0.7×10$^{16}$/cm$^3$ and the width is at 0.3 μm. With the semiconductor device 100, when the gate voltage Vg is off, the P$^{--}$ diffusion region 52 is depleted prior to the P diffusion region 51 and the P diffusion region 51 is brought into a floating state. This enables the semiconductor device 100 of this embodiment to have a withstand voltage structure, like the floating structure.

In order to realize a high withstand voltage in the floating structure, the P diffusion region 51, which is a buried region, is arranged at a position where the field peak is formed at two portions including the PN junction between the P$^-$ body region 41 and the N$^-$ drift region 12 and the PN junction between the P diffusion region 51 and the N$^-$ drift region 12. Preferably, the arrangement is such that both peak values are equal to each other.

With the semiconductor device 100 of this embodiment, when the gate voltage Vg is switched on, holes are supplied to the P diffusion region 51 via the P$^{--}$ diffusion region 52, so that a depletion layer spreading in the N$^-$ drift region 12 is rapidly narrowed. Thus, a good on-resistance characteristic is obtained. On the other hand, when the gate voltage Vg is switched off, the P$^{--}$ diffusion region 52 is depleted prior to the P diffusion region 51, thereby providing a withstand voltage structure similar to the floating structure.

It will be noted that the region where the P$^{--}$ diffusion region 52 is depleted therein can be a part in a longitudinal direction. More particularly, it is enough to have an ultrahigh resistance state even at part of the portion between the P$^-$ body region 41 and the P diffusion region 51. To this end, part of the N$^-$ drift region 12 may be made high in concentration, or part of the P$^{--}$ diffusion region 52 may be made low in concentration.

Preferably, a RESURF structure is applied to the P$^{--}$ diffusion region 52 so as to suppress a lowering of withstand voltage. More particularly, the floating structure is realized by completely depleting the P$^{--}$ diffusion region 52 and its peripheral N$^-$ drift region 12. It is to be noted that although the best conditions are such that the P$^{--}$ diffusion region 52 and its peripheral N$^-$ drift region 12 are completely depleted to provide the RESURF structure, such a completely depleted state may not be necessarily required. That is, the conditions where the P$^{--}$ diffusion region 52 becomes high in resistance are sufficient to enable a withstand voltage structure, similar to the floating structure, to be realized.

Table 1 shows the results obtained from simulation of conditions of width and concentration of the P$^{--}$ diffusion region 52 in MOSFET whose withstand voltage between drain-source is designed at 70 V. The conditions other than those of the P$^{--}$ diffusion region 52 are similar to in this embodiment. The distance between the end portion 210 of the gate trench and the side face of the terminal trench 621 is set at about 1.1 μm. Under such conditions as mentioned above, the width and concentration of the P$^{--}$ diffusion region 52 are so set as to permit the P$^{--}$ diffusion region 52 to be depleted.

TABLE 1

| Width of P-- diffusion region | Concentration of P-- diffusion region |
|---|---|
| 0.3 μm-0.7 μm | 3 × 10$^{16}$/cm$^3$-1 × 10$^{17}$/cm$^3$ |

According to this simulation, the RESURF state or a state close thereto was attained within a range satisfying the conditions of Table 1, thereby obtaining desired characteristics (withstand voltage and on-resistance). From the results of Table 1, it will be seen that if an ion implantation dosage varies more or less at the time of formation of the P$^{--}$ diffusion region 52, desired characteristics are obtained in so far as the conditions are close to the RESURF relation. That is, it is revealed that a margin for manufacture is great.

Figure 4:
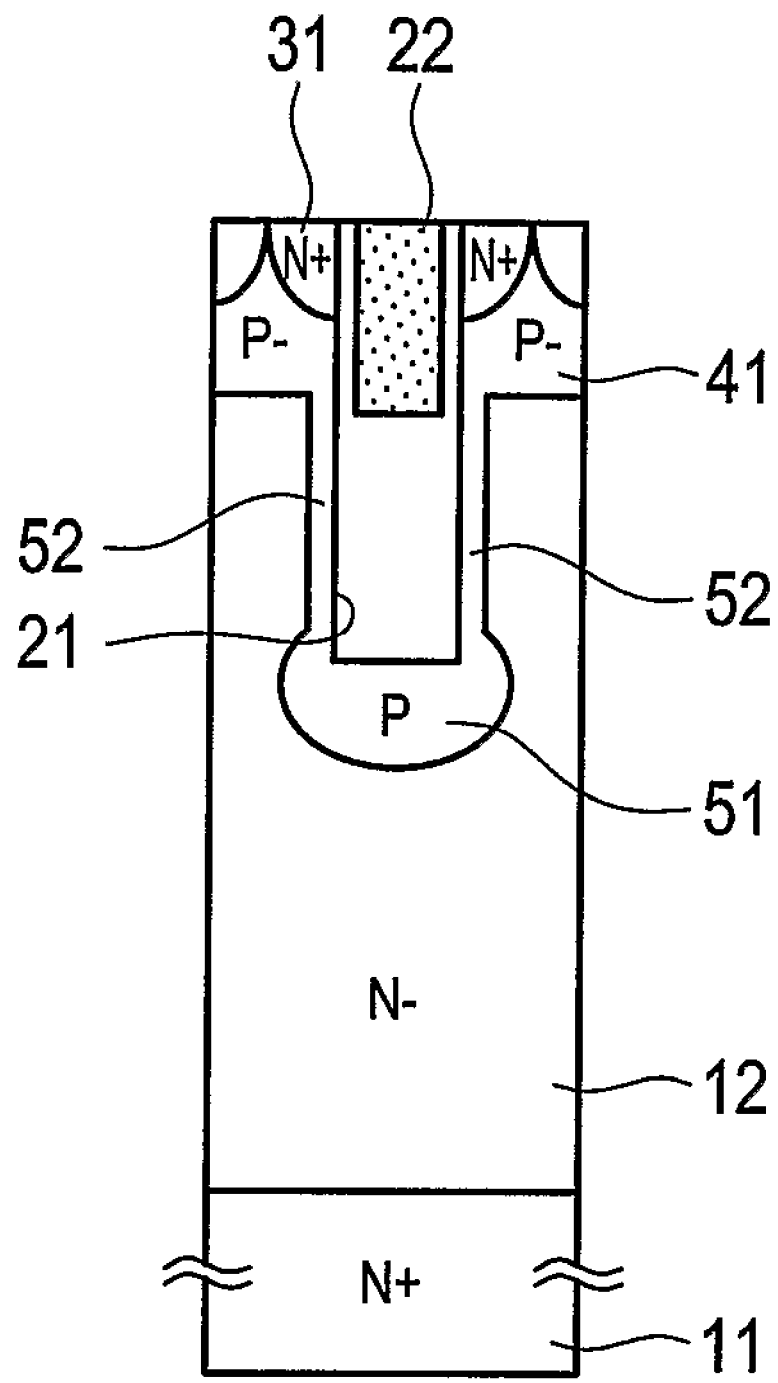
FIG. 4 is a view showing a semiconductor device provided with a $P^{--}$ diffusion region at side wall portions other than an end portion of a gate trench.

With the semiconductor device 100 of this embodiment, conversion into high on-resistance can be avoided by the provision of the P$^{--}$ diffusion region 52 at the end portion 210 of the gate trench 21. In other words, while the P$^{--}$ diffusion region 52 brings about a good on-resistance characteristic upon switching, high resistance is involved for channel current. As shown in FIG. 4, if the P$^{--}$ diffusion region 52 is provided below the channel region, the on-resistance becomes very high. To cope with this, as shown in FIG. 3, the P$^{--}$ diffusion region 52 is formed only at the end portion 210 of the gate trench 21. In this way, an influence on the on-resistance characteristic is avoided.

Figure 5:
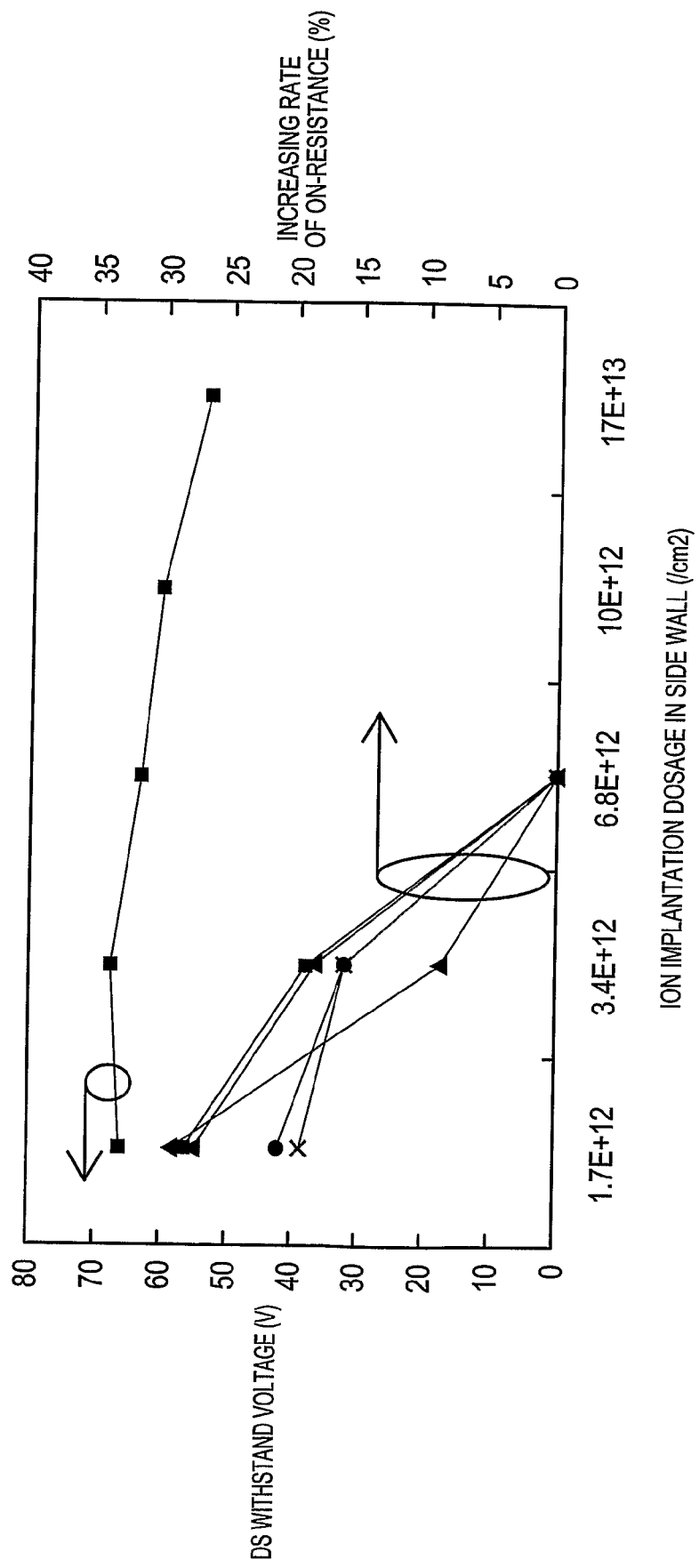
FIG. 5 is a graph showing the relationship between a dosage to the end portion of a gate trench and an increasing rate of on-resistance.

FIG. 5 shows the results of experiments checking the relation between the ion implantation dosage at the time of formation of the P$^{--}$ diffusion region 52 and the withstand voltage between drain-source (between D-S) and also the relation between the ion implantation dosage and the increasing rate of on-resistance at the time of switching operation, both in the semiconductor device 100 of this embodiment. It will be noted that the semiconductor device of the embodiment has such a structure that an intended value of the withstand voltage between D-S is set at 60 V.

As shown in FIG. 5, it has been found that a dosage greater than 7.0×10$^{12}$/cm$^2$ results in little increase in on-resistance at the time of AC operation. On the other hand, with the semiconductor device 100, the P$^-$ body region 41 and the P diffusion region 51 are in a connected state with each other, so that there is concern that the withstand voltage between drain-source (between D-S) lowers. In particular, it has been confirmed in the experiments that if a dosage is smaller than 2×10$^{13}$/cm$^2$, an intended withstand voltage is ensured. In accordance with the experiments, however, it has been found that the provision of the P$^{--}$ diffusion region 52 at the end portion 210 of the gate trench 21 leads to an improvement in switching characteristic while keeping a high withstand voltage.

Next, the manufacturing process of the semiconductor substrate 100 is described based on FIG. 6. Initially, an N⁻-type silicon layer is formed on an N⁺ substrate serving as an N⁺ drain region 11 by epitaxial growth. This N⁻-type silicon layer (epitaxial layer) is a portion that becomes regions including an N⁻ drift region 12, a P⁻ body region 41, an N⁺ source region 31 and a contact P⁺ region 32.

Figure 6A:
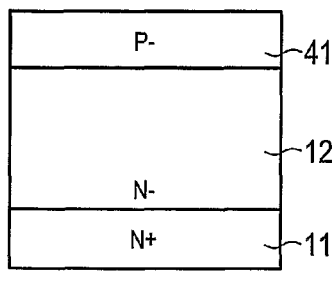
FIG. 6 is a view showing manufacturing steps of the insulated gate-type semiconductor device according to the first embodiment.

Next, as shown in FIG. 6(A), a P⁻ body region 41 is formed at an upper surface side of the semiconductor substrate such as by ion implantation or the like. As a result, the semiconductor substrate having the P⁻ body region 41 on the N⁻ drift region 12 is formed.

Figure 6B:
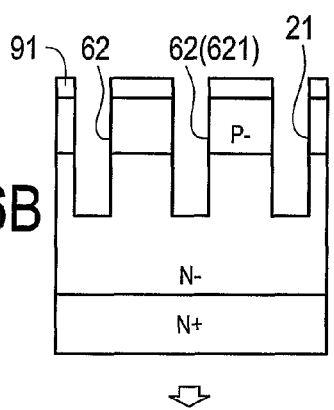

Next, as shown in FIG. 6(B), a pattern mask 91 is formed over the semiconductor substrate for carrying out trench dry etching. According to the trench dry etching, a gate trench 21 and a terminal trench 62, each passing through the P⁻ body region 41, are collectively formed.

Figure 6C:
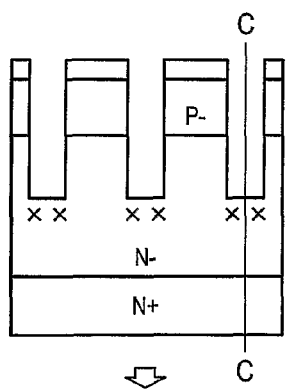
Figure 7:
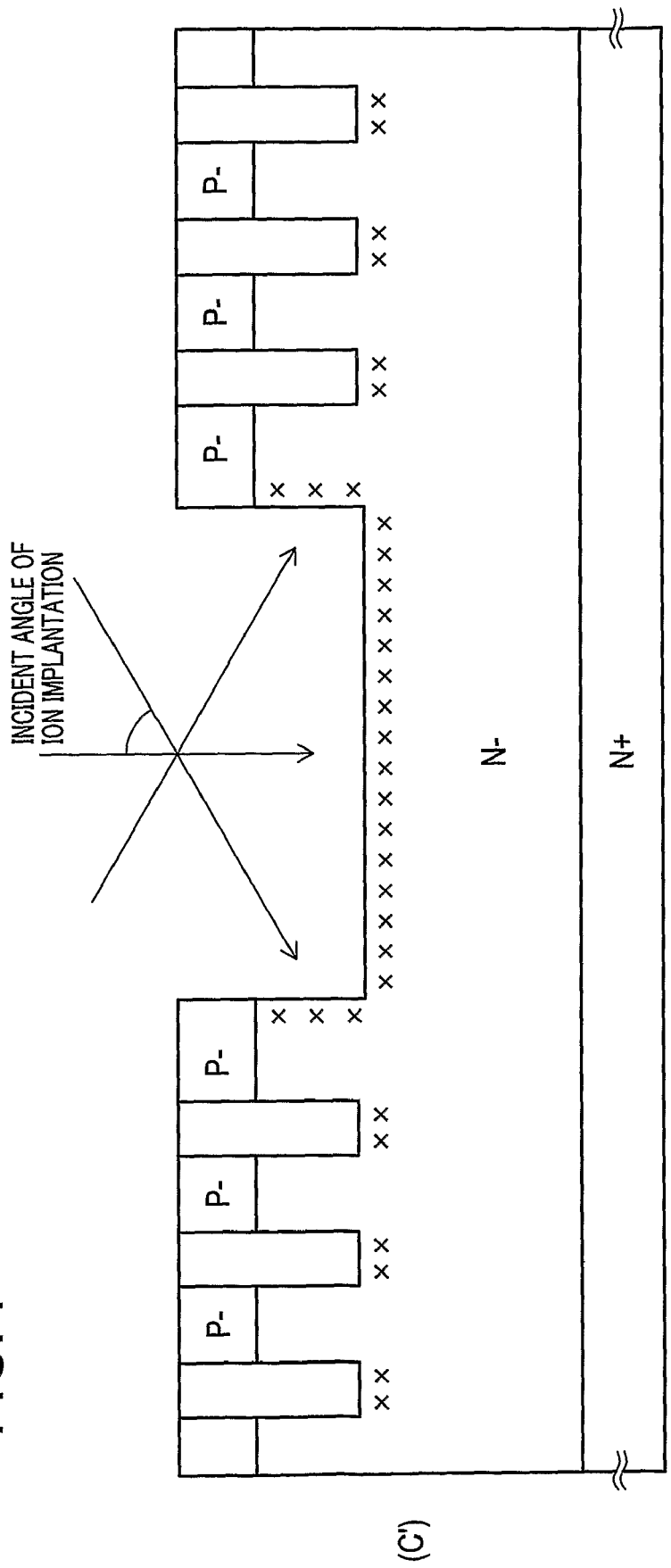
FIG. 7 is a view showing a C-C section of the semiconductor device in the course of the ion implantation shown in FIG. 6.

Next, as shown in FIG. 6(C), an impurity is implanted from the bottom of the respective trenches by ion implantation. Moreover, an impurity is implanted from the side face at the end portion of individual gate trenches by inclined ion implantation. More particularly, as shown in FIG. 7 (C'), ion implantation is carried out along a lengthwise direction of the straight gate trench 21 at an incident angle of not lower than 20 degrees. In this embodiment, this is effected at 60 degrees. That is, since the implantation is performed along the lengthwise direction of the gate trench 21, the impurity can be implanted to the side face at a deep position of the gate trench 21 even if an incident angle of ion implantation is made great. The incident angle is great, so that reflection at the side face of the trench is suppressed. Thus, the concentration and size of the P⁻⁻ diffusion region 52 can be accurately controlled.

Figure 6D:
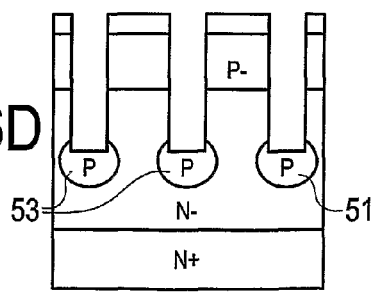

Thereafter, as shown in FIG. 6(D), annealing treatment is carried out to collectively form a P floating region 51 and a P floating region 53. More particularly, the P floating regions are simultaneously formed in all areas by one annealing treatment. It will be noted that the annealing treatment may be effected after deposition of an insulating film 92 as will be described hereinafter.

Figure 6E:
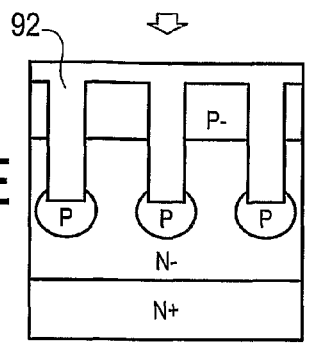

Next, as shown in FIG. 6(E), an insulating film 92 is deposited inside the gate trench 21 and the terminal trench 62 according to the CVD (chemical vapor deposition) method. For the insulating film 92, there is used, for example, a SiO₂ film formed by a low-pressure CVD method using TEOS (tetraethyl-orso-silicate) as a starting material or a CVD method using ozone and TEOS as starting materials. This insulating film 92 becomes the deposited insulating layers 23, 71, 73 in FIG. 2.

Figure 6F:
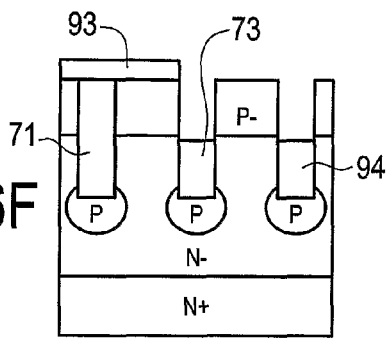

Next, after removal of the insulating film 92 from the main surface, a resist 93 is formed on the main surface. The resist 93 is patterned to form an etching protective film for terminal area. As shown in FIG. 6(F), dry etching is carried out using the resist 93 as an etching protective film. In this manner, spaces for forming a gate electrode 22 and a terminal gate region 72 are secured. After etching back, the resist 93 is removed.

Figure 6G:
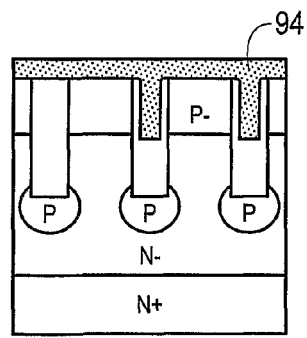
Figure 6H:
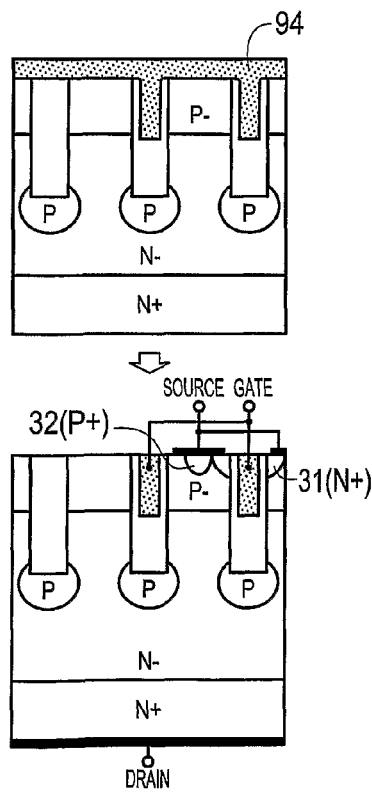

Next, thermal oxidation treatment is carried out to form a thermal oxide film on the silicon surface. This thermal oxide film becomes the gate insulating films 24, 74 in FIG. 2. Next, as shown in FIG. 6(G), a gate material 94 is deposited on the spaces secured by the etching back. For specific film-forming conditions of the gate material 94, there are used, for example, a mixed gas containing SiH₄ as a reactant gas and a film-forming temperature of 580° C.–640° C., under which a polysilicon film having a thickness of about 800 nm is formed by a normal pressure CVD method. This gate material 94 becomes a gate electrode 22 and a terminal gate region 72 in FIG. 3.

Next, the gate material 94 is etched. By this, a gate electrode 22 and a terminal gate region 72 are formed. In the etching step, etching is carried out to provide an integral region where the gate electrode 22 and the terminal gate region 72 are connected with each other. Thereafter, boron, phosphorus or the like is ion implanted into a portion in which the P⁻ body region 41 has been formed, followed by thermal diffusion treatment to form an N⁺ source region 31 and a contact P⁺ region 32. Subsequently, an interlayer insulating film and the like are formed over the semiconductor substrate, and finally, a source electrode, a drain electrode and the like are formed to manufacture a trench gate-type semiconductor device 100.

Application of the First Embodiment

Figure 8:
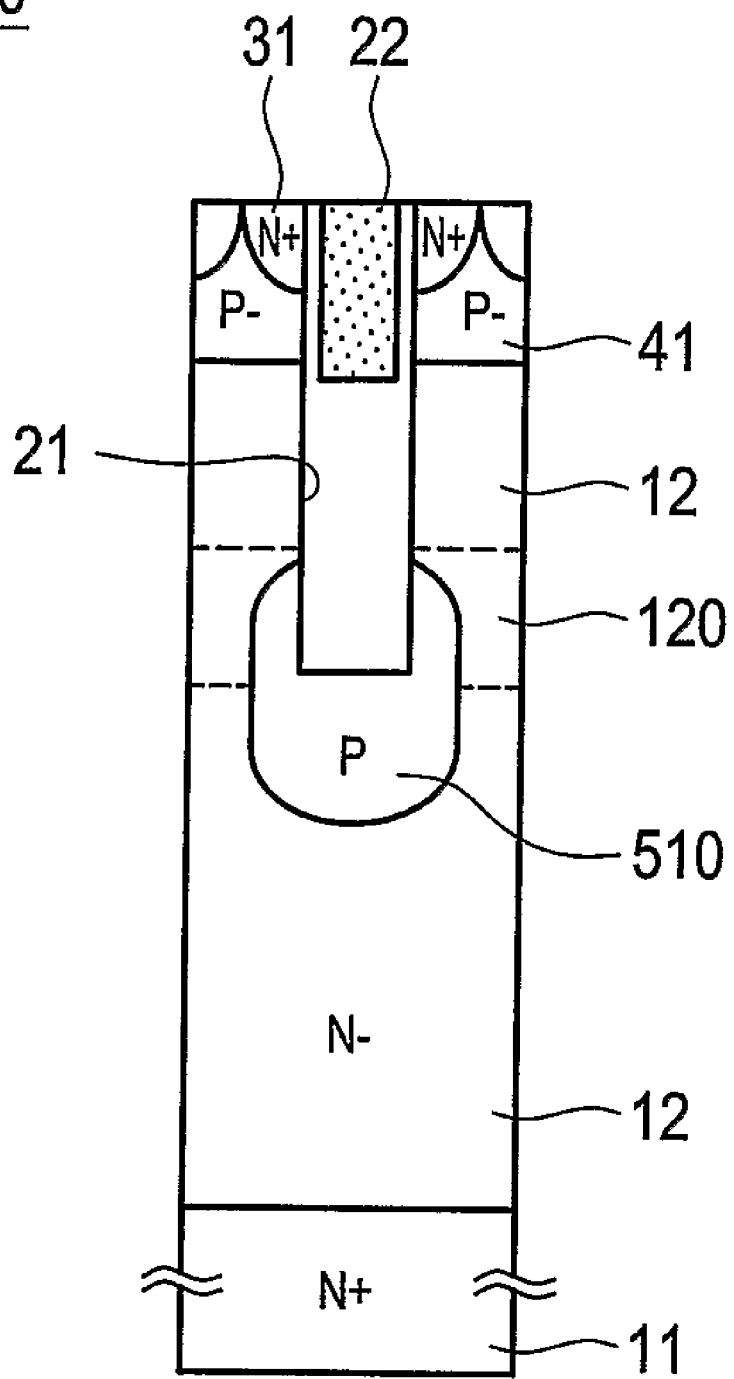
FIG. 8 is a sectional view showing an application of the insulating gate-type semiconductor device according to the first embodiment.

An application of the embodiment is shown in FIG. 8. A semiconductor device 110 according to the application has, around the bottom of the gate trench 21, a P diffusion region 510 whose section is in the form of a vertically long ellipse. Because the section of the P diffusion region 510 is formed as being vertically long, the thickness of the depletion layer spreading inside the N⁻ drift region 12 can be made thicker than with the case of the semiconductor device 100 (FIG. 2). Accordingly, the semiconductor device 110 of this embodiment is better in withstand voltage than the semiconductor device 100.

For forming the vertically long P diffusion region 510, the epitaxial layer is inclined with respect to the distribution of specific resistance (concentration) in a longitudinal direction. More particularly, a high resistance layer 120 whose specific resistance gradually increases upwardly is disposed above the P diffusion region 510. By the provision, when the P diffusion region 510 is formed, its extension in a longitudinal direction increases. Eventually, the P diffusion region 510 become vertically long in shape.

As having stated hereinabove in detail, with the semiconductor device 100 of the first embodiment, the P⁻⁻ diffusion region 52, which is in connection with the P⁻ body region 41 and the P diffusion region 51 and is lower in concentration than both regions, is provided therebetween. The P⁻⁻ diffusion region 52, which is located at the side surface side of the end portion of the gate trench 21, is designed to have such a concentration and width as to be depleted prior to the P diffusion region 51 positioned at the bottom surface side of the gate trench 21 when the gate voltage Vg is off.

More particularly, the semiconductor device 100 is so arranged that when the gate voltage Vg is switched off, the P⁻⁻ diffusion region 52 is depleted prior to the P diffusion region 51. This permits the P diffusion region 51 to be electrically in a floating state. Accordingly, the semiconductor device 100 has a withstand voltage structure similar to a floating structure results. Thus, a high withstand voltage is attained.

On the other hand, with the semiconductor device 100, when the gate voltage Vg is switched on after spreading of a depletion layer, holes are supplied to the P diffusion region 51 via the P⁻⁻ diffusion region 52. In other words, the P⁻⁻ diffusion region 52 serves as a supply path of holes to the P diffusion region 51. In this way, the depletion layer spreading within the N⁻ drift region 12 is rapidly narrowed. Eventually, a good on-resistance characteristic is obtained. Accordingly, there is realized an insulated gate-type semiconductor device which is high in withstand voltage and wherein a good on-resistance characteristic is obtained at the time of AC operation.

The P$^{--}$ diffusion region 52 is provided at a position of contact with the end portion 210 along the lengthwise direction of the gate trench 21. In doing so, little influence is given on channel current, and conversion into high on-resistance is avoided. Because of the location at the end portion 210 of the gate trench 21, the P$^{--}$ diffusion region 52 can be formed by inclined ion implantation using a great incident angle. This permits the concentration and size to be strictly controlled, thereby obtaining stable device characteristics.

Second Embodiment

Figure 9:
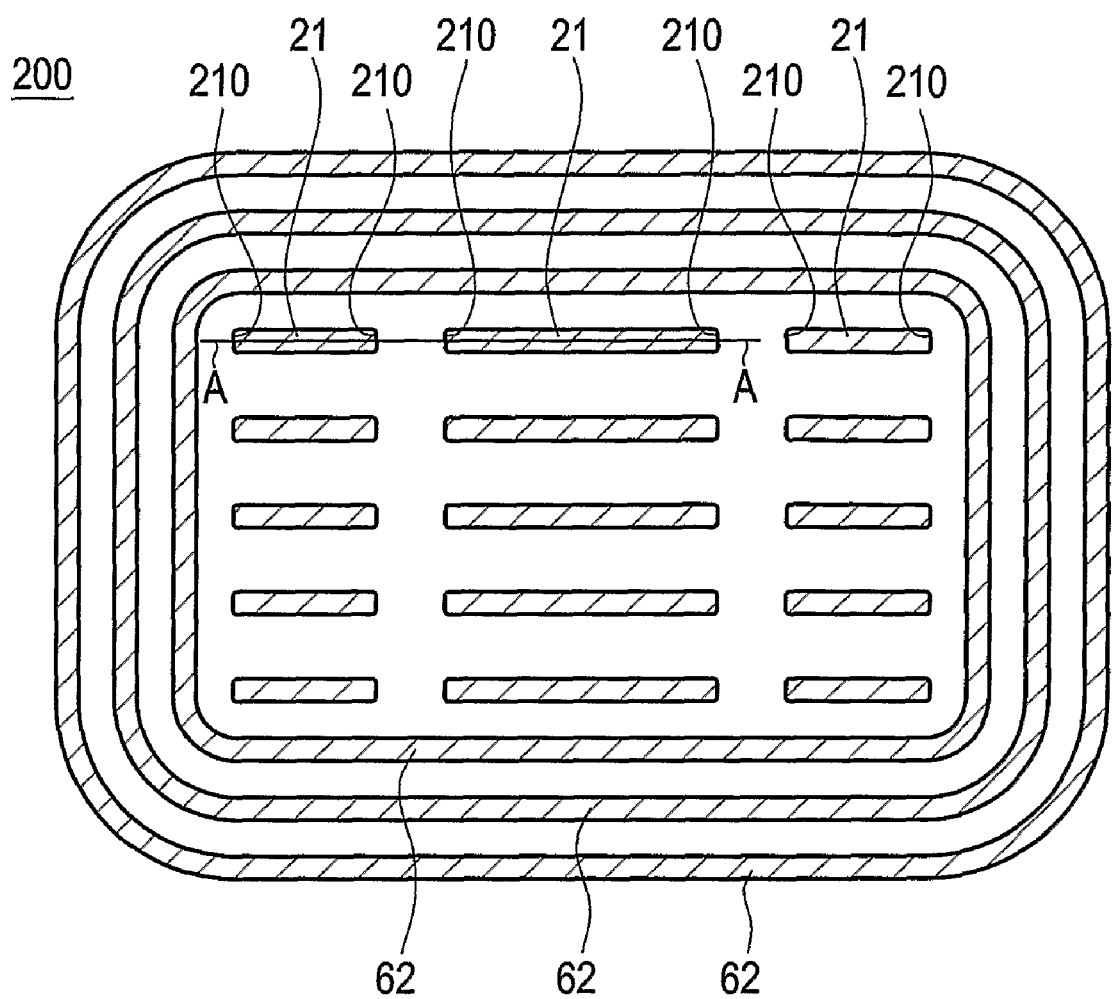
FIG. 9 is a plan view showing a structure of an insulated gate-type semiconductor device according to a second embodiment.

As shown in FIG. 9, a semiconductor device 200 of the second embodiment is formed with gate trenches 21 that have such a layout as to be divided into three groups in a lengthwise direction. With the semiconductor device 200, the gate trenches 21 are arranged to have a layout of being divided into a plurality of sub-trenches, so that the number of end portions 210 is larger than in the first embodiment. That is, the end portions 210 are two in number on the lengthwise direction in the first embodiment and are six in number on the lengthwise direction in this embodiment.

Figure 10:
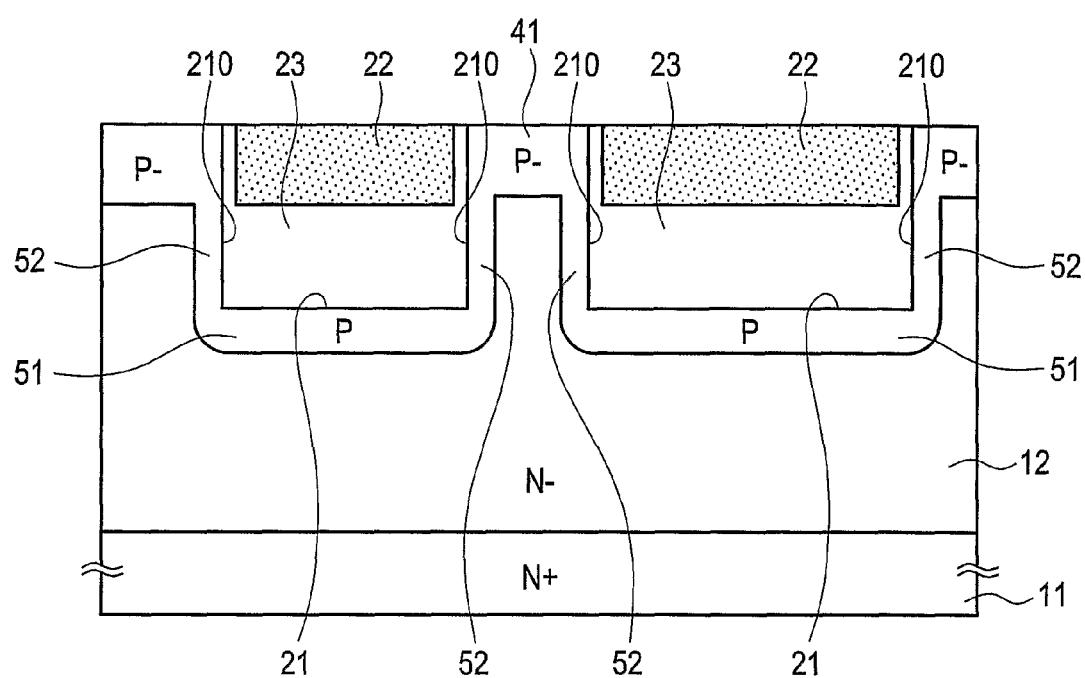
FIG. 10 is a view showing an A-A section of the insulated gate-type semiconductor device shown in FIG. 9.

As shown in FIG. 10, a P$^{--}$ diffusion region 52 surrounded with an N$^-$ drift region 12 is formed around the end portion 210 of individual sub-trenches. Like the first embodiment, the P$^{--}$ diffusion region 52 is in connection with a P$^-$ body region 41 at an upper end thereof and also with a P diffusion region 51 at a lower end thereof. That is, the P$^{--}$ diffusion region 52 serves as a supply path of holes.

The interval of the adjacent sub-trenches in the lengthwise direction is appropriately within a range of from 1 µm to a pitch between the gate trenches 21, 21, (2.5 µm in this embodiment). This is a dimension capable of depletion at a portion sandwiched between the P$^{--}$ diffusion regions 52, 52 within the N$^-$ drift region 12. Preferably, the dimension is determined to allow application of the RESURF structure to between the end portions 210, 210 of the sub-trenches. It will be noted that it is necessary to separately connect gate wires without breaking thereof, which is responsible by design of gate wiring.

The semiconductor device 200 of this embodiment has the P$^{--}$ diffusion regions 52 (i.e. supply paths of holes) larger in number than with the case of the first embodiment. Thus, a greater number of holes are supplied through the P$^{--}$ diffusion regions 52. Even if a chip size is large, a good on-resistance characteristic is obtained. As a matter of course, since the P$^{--}$ diffusion region 52 is formed at the end portion of the sub-trench, an increase of channel resistance can be suppressed to minimum.

The gate trenches 21 have such a layout as to be divided in a lengthwise direction, so that the P$^{--}$ diffusion region 52 can be formed at the central portion of the cell area. More particularly, a hole supply path can be formed at the central portion of the cell area, thereby more quickly supplying holes substantially uniformly throughout the cell area.

Figure 11:
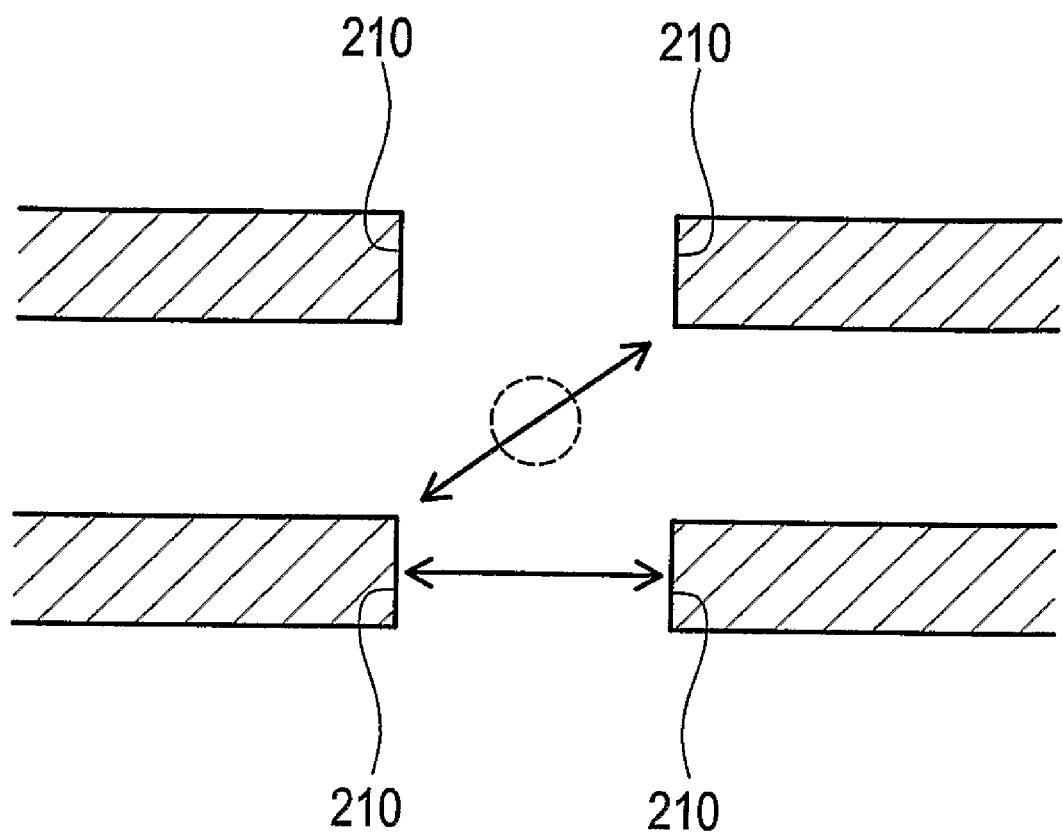
FIG. 11 is a view showing a portion in which a distance between $P^{--}$ diffusion regions is long.
Figure 12:
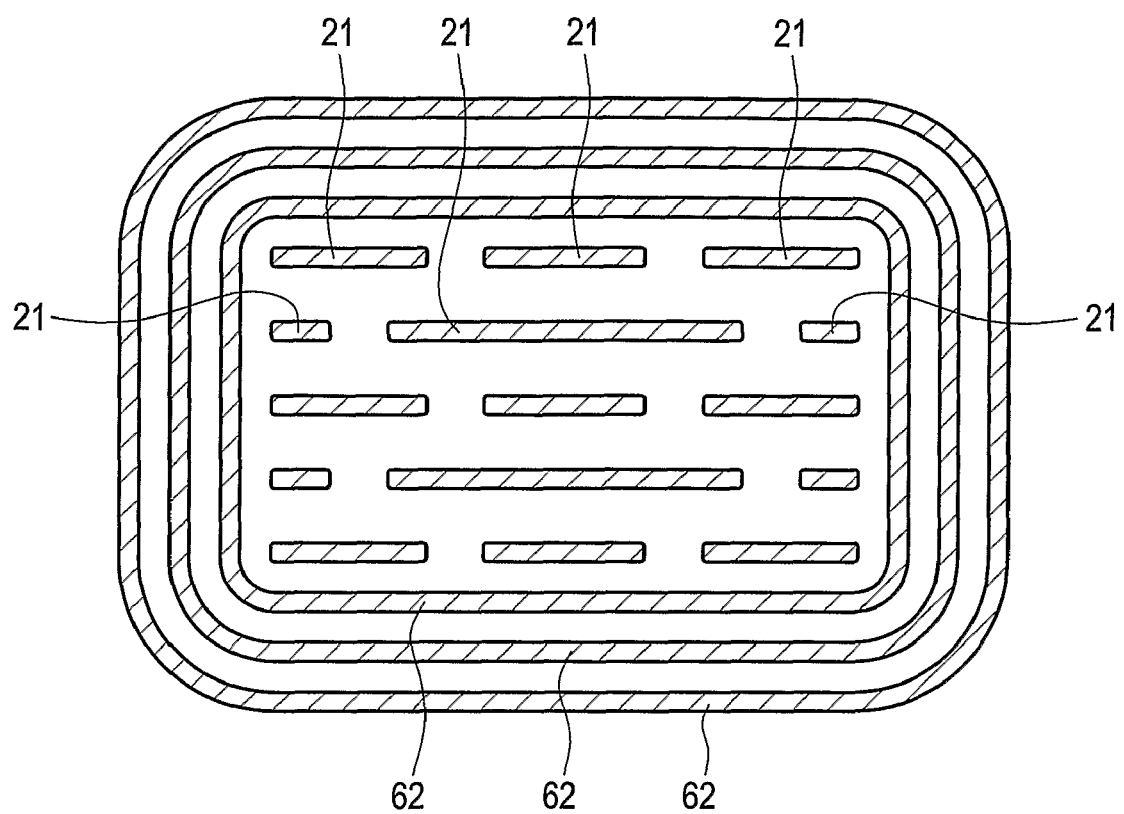
FIG. 12 is a plan view showing an application (No. 1) of the insulated gate-type semiconductor device according to the second embodiment.

It will be noted that the gate trenches of the semiconductor device 200 shown in FIG. 9 have such a layout that the positions on the lengthwise direction of the end portions 210 are in line. Such a layout permits an electric current to run substantially uniformly throughout the cell area. On the other hand, with such a layout in which the end portions are positioned in line with one another, some portions involve a distance between the end portions 210 and 210, more particularly, a distance between the P diffusion regions 51 and 51, which becomes longer as shown in FIG. 11. Accordingly, there is concern that the withstand voltage lowers. To cope with this, as shown in FIG. 12, the layout is so arranged that the positions along the lengthwise direction of the end portions 210 are mutually shifted, for which a variation in the distance between the P diffusion regions 51 and 51 becomes small, thereby suppressing a lowering of withstand voltage.

Figure 13:
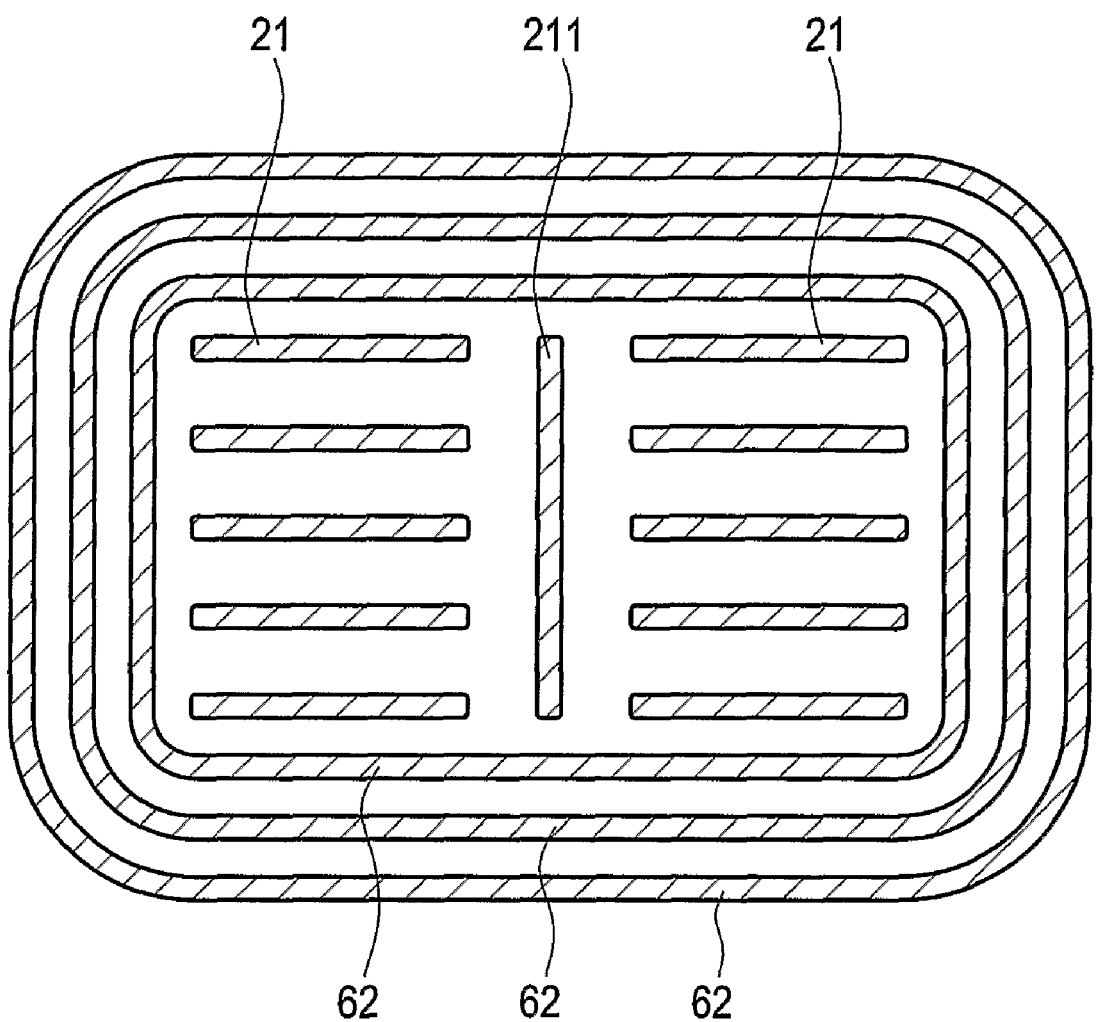
FIG. 13 is a plan view showing another application (No. 2) of the insulated gate-type semiconductor device according to the second embodiment.

As shown in FIG. 13, a trench 211 having a gateless structure is provided between the end portions 210, 210 of the gate trenches 21 in a direction intersecting at right angles with the lengthwise direction of the gate trenches 21. A P diffusion region in a floating state is provided around the bottom of the trench 211. More particularly, a total layout is such that the relationship between the end portion 210 of the gate trench 21 and the trench 211 is the same as the relationship between the end portion 210 of the gate trench 21 and the terminal trench 62. With such a layout as mentioned above, a variation in the distance between the P diffusion regions becomes small, thereby suppressing a lowering of withstand voltage.

The semiconductor device 200 of this embodiment can be manufactured substantially in the same manner as the semiconductor device 100 of the first embodiment. More particularly, the difference between the manufacturing method of the semiconductor device 200 and the manufacturing method of the semiconductor device 100 resides in that a resist used to form the gate trench 21 (FIG. 6(B)) is patterned in conformity with a gate trench 21 (sub-trench) of the semiconductor device 200. To this end, the P$^{--}$ diffusion region 52 is formed by inclined ion implantation, like the first embodiment. Individual P$^{--}$ diffusion regions 52 can be formed according to the same ion implantation step, and thus, the steps do not increase in number when compared with the first embodiment.

Third Embodiment

Figure 14:
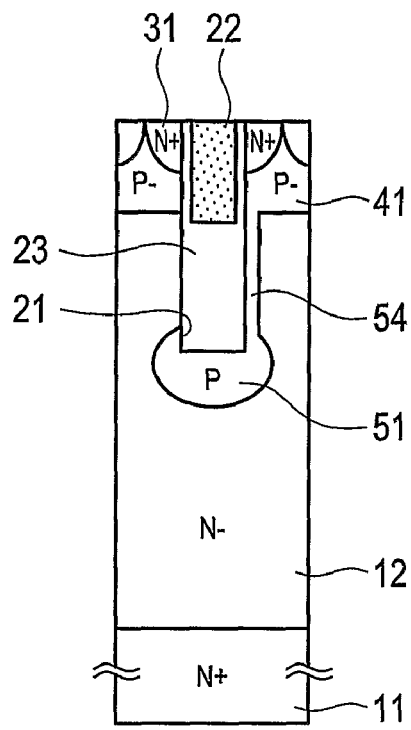
FIG. 14 is a sectional view showing a structure of an insulated gate-type semiconductor device according to a third embodiment.

As shown in FIG. 14, a semiconductor device 300 of the third embodiment is formed with a P$^{--}$ diffusion region 54 surrounded by an N$^-$ drift region 12 around one side surface of a gate trench 21. The P$^{--}$ diffusion region 54 is in connection with a P$^-$ body region 41 at an upper end thereof and also with a P diffusion region 51 at a lower end, like the first embodiment. That is, the P$^{--}$ diffusion region 54 serves as a hole supply path. The semiconductor device 300 of this embodiment differs from that of the first embodiment in that the hole supply path is whichever of the side surface portion and the end portion of the gate trench 21. It is to be noted that the position of the P$^{--}$ diffusion region 54 may be at the side surface of the left side or the right side of the gate trench 21.

With the semiconductor device 300 of this embodiment, since the P$^{--}$ diffusion region 54 serving as a hole supply path is formed on the side surface of the gate trench 21, it is easy to manufacture in comparison with the first embodiment where the region is formed at the end portion 210.

It will be noted that with the case of the semiconductor device 300 of the embodiment, if the P$^{--}$ diffusion region 54 is formed on both side walls of the gate trench 21, the on-resistance becomes very high (see FIG. 4). This is the reason why the P$^{--}$ diffusion region 54 is formed only on one side wall.

Figure 15:
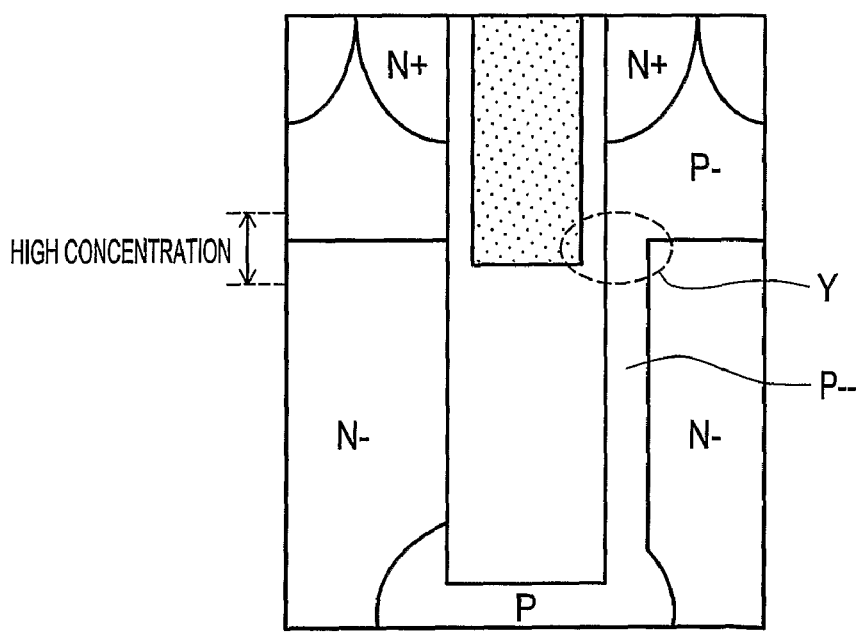
FIG. 15 is a view showing a junction between the $P^{--}$ diffusion region and the body region of the insulated gate-type semiconductor device shown in FIG. 14.

Even when the P$^{--}$ diffusion region 54 is formed only on one side, the P$^{--}$ diffusion region 54 and the P$^-$ body region 41 are superposed at the connected portion thereof (within a broken line frame Y in FIG. 15) to increase a concentration, thus making it difficult to invert. In other words, it has to be admitted that a channel resistance is apt to become high. To avoid this, the semiconductor device 300 is so arranged that the specific resistance (concentration) of the epitaxial layer is longitudinally controlled. That is, the specific resistance of the epitaxial layer is so controlled that the connected portion between the P$^{--}$ diffusion region 54 and the P$^-$ body region 41 is higher than the other portions with respect to the concentration therein. More specifically, although differing depending on the withstand voltage zone in the semiconductor device, the conditions of the P$^{--}$ diffusion region 54 and the like, the concentration is so controlled as to be about 3 to 10 times greater than those in ordinary regions. In this way, the device is suppressed from becoming a high on-resistance.

The semiconductor device 300 of this embodiment can be manufactured substantially in the same manner as the semiconductor device 100 of the first embodiment. More particularly, the difference between the manufacturing method of the semiconductor device 300 and the manufacturing method of the semiconductor device 100 resides in the difference of a direction of inclined ion implantation when the P$^{--}$ diffusion region is formed on a wall surface of a gate trench 21 (FIG. 6(C)). Individual P$^{--}$ diffusion regions 54 may be formed by the same ion implantation step, so that the number of steps does not increase in comparison with the first embodiment.

Fourth Embodiment

Figure 16:
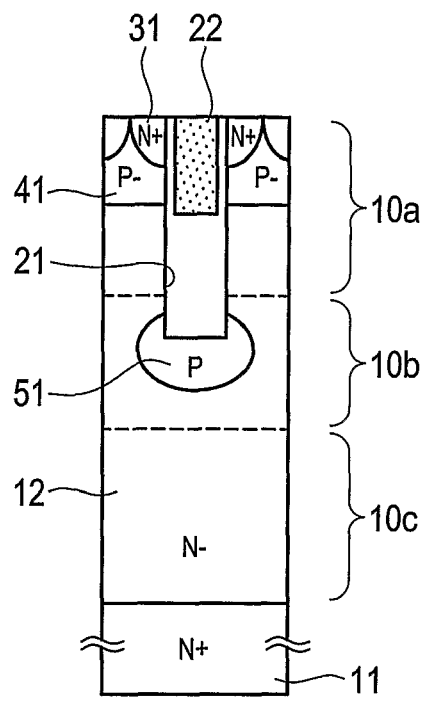
FIG. 16 is a sectional view showing a structure (an epitaxial layer with a three-layered structure) of an insulated gate-type semiconductor device according to a fourth embodiment of the invention.

As shown in FIG. 16, a semiconductor device 400 of the fourth embodiment is formed with a P diffusion region 51 in a floating state within an N$^-$ drift region 12. The end of the gate trench 21 is positioned within the P diffusion region 51. With the semiconductor device 400 of this embodiment, the P diffusion region 51 is in a floating state, and no P diffusion region connected with the P$^-$ body region 41 is formed. In other words, the semiconductor device 400 has a floating structure and no hole supply path to the P diffusion region 51 is provided. This differs from the first embodiment wherein it is intended to improve the on-resistance characteristic through the supply of holes.

The semiconductor device 400 of this embodiment has a feature of longitudinal distribution of a specific resistance (concentration) of the epitaxial layer. More particularly, an epitaxial layer 10 of the semiconductor device 400 has a three-layered structure as shown in FIG. 16. Particularly, in this embodiment, there are included a low concentration layer 10a having a concentration of $0.5 \times 10^{16}/cm^3$ (high specific resistance layer), a high concentration layer 10b having a concentration of $3.0 \times 10^{16}/cm^3$ (low specific resistance layer), and a standard concentration layer 10c having a concentration of $2.0 \times 10^{16}/cm^3$ (standard specific resistance layer). The high concentration layer 10b includes a P diffusion region 51. That is, the upper face of the high concentration layer 10b is positioned above the upper end of the P diffusion region 51, and the lower face of the high concentration layer 10b is positioned below the lower end of the P diffusion region 51.

The high concentration layer 10b surrounding the P diffusion region 51 has a concentration higher than the other layers. Accordingly, when the gate voltage Vg is off, spreading of a depletion layer is small in degree. Even if holes are not supplied to the P diffusion region 51 upon switching, a drift current is not impeded because of the depletion layer not originally spreading over a wide range. Thus, a good on-resistance characteristic is obtained in comparison with the semiconductor device having a floating structure of the standard concentration layer alone (see FIG. 24).

Figure 17:
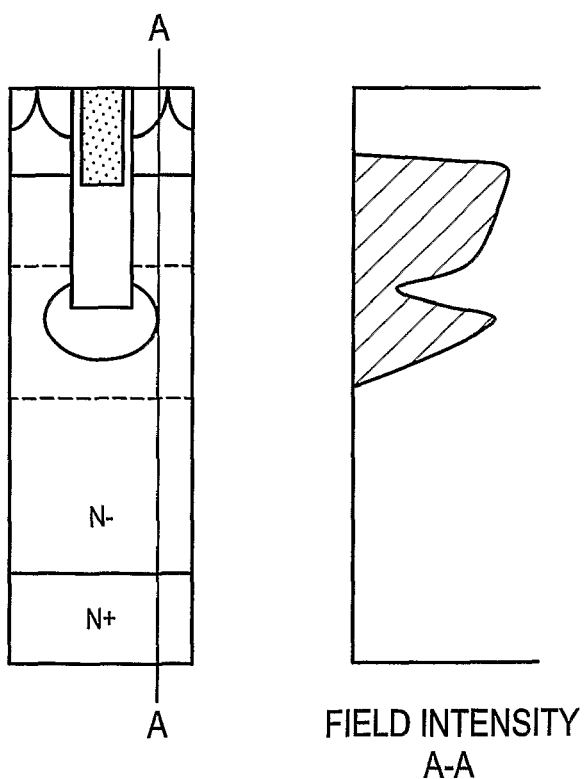
FIG. 17 is a view showing a field intensity of the insulated gate-type semiconductor device according to the fourth embodiment of the invention.

It will be noted that if the epitaxial layer is highly concentrated so that a depletion layer spreading from the PN junction between the N$^-$ drift region 12 and the P diffusion region 51 (which depletion layer being hereinafter referred to as a "lower depletion layer") is made difficult to spread, a withstand voltage lowers. To cope with this, the low concentration layer 10a located above the high concentration layer 10b is made low in concentration. By this, as shown in FIG. 17, the withstand voltage can be ensured with the aid of a depletion layer spreading mainly from the PN junction between the N$^-$ drift region 12 and the P$^-$ body region 41 (which depletion layer being hereinafter referred to as an "upper depletion layer"), thereby suppressing the withstand voltage from lowering.

More particularly, because the region where the upper depletion layer spreads is low in concentration, a variation in field intensity is small. For this, with the low concentration layer 10a, a variation in field intensity is gentle. On the other hand, the region where the lower depletion layer spreads is high in concentration, so that a variation in field intensity is great. Accordingly, with the high concentration layer 10b, a variation in field intensity is sharp. The design is made such that the two peak values are both below a desired withstand voltage, preferably both peak values being same. In this way, a lowering of withstand voltage is suppressed.

It will be noted that if the lower depletion layer spreads to the standard concentration layer 10c, an adverse influence is given on the on-resistance characteristic immediately after switching. To avoid this, the concentration and thickness of the high concentration layer 10b is so designed that the lower end of the lower depletion layer does not arrive at the lower face of the high concentration layer 10b.

Figure 18:
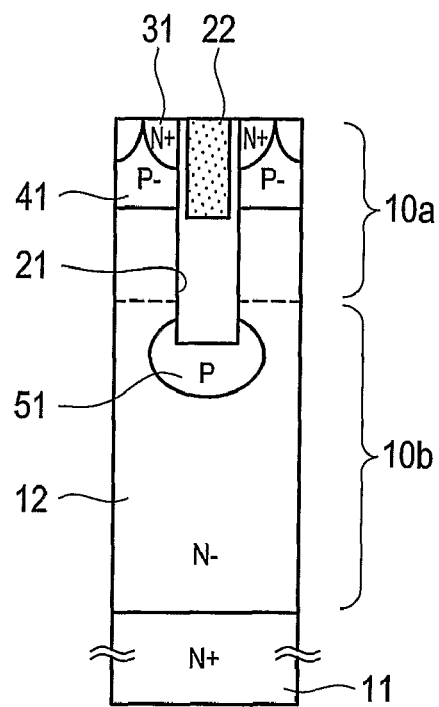
FIG. 18 is a sectional view showing a structure (an epitaxial layer with a double-layered structure) of the insulated gate-type semiconductor device according to the fourth embodiment.

In this embodiment, although the three-layered structure is provided wherein the standard concentration layer 10c is disposed below the high concentration layer 10b, limitation is not placed thereto. For instance, as shown in FIG. 18, a double-layered structure may be used in which those below the lower concentration layer 10a are all made of the high concentration layer 10b.

The semiconductor device 400 of the embodiment can be manufactured substantially in the same manner as the conventional semiconductor device 900. More particularly, the difference between the manufacturing method of the semiconductor device 400 and the manufacturing method of the semiconductor device 900 resides only in that an epitaxial layer whose concentration longitudinally changes is formed beforehand.

Application 1 of the Fourth Embodiment

Figure 19:
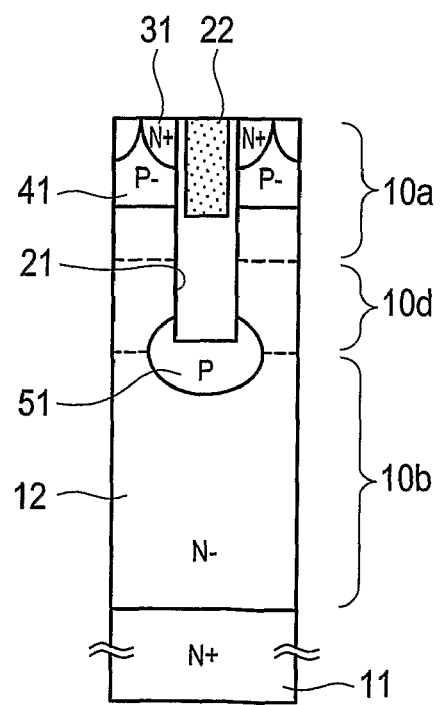
FIG. 19 is a sectional view showing an application 1 (No. 1) of the insulated gate-type semiconductor device according to the fourth embodiment.

Application 1 of this embodiment is shown in FIG. 19. A semiconductor device 410 according to Application 1 has an epitaxial layer whose specific resistance (concentration) gently changes in a longitudinal direction. In other words, a concentration distribution is changed over a wide range. In addition, limitation is placed on a position where the concentration starts to change. A feature resides in these two points.

The epitaxial layer 10 of the semiconductor device 410 is constituted of a low concentration layer 10a (high specific resistance layer) that is positioned at a surface side of the semiconductor device 400 and is low in concentration, a high concentration layer 10b (low specific resistance layer) that is positioned at a substrate side and is high in concentration, and an intermediate layer 10d that is positioned between the low concentration layer 10a and the high concentration layer 10b and whose concentration gently changes from the low concentration layer 10a toward the high concentration layer 10b.

Figure 20:
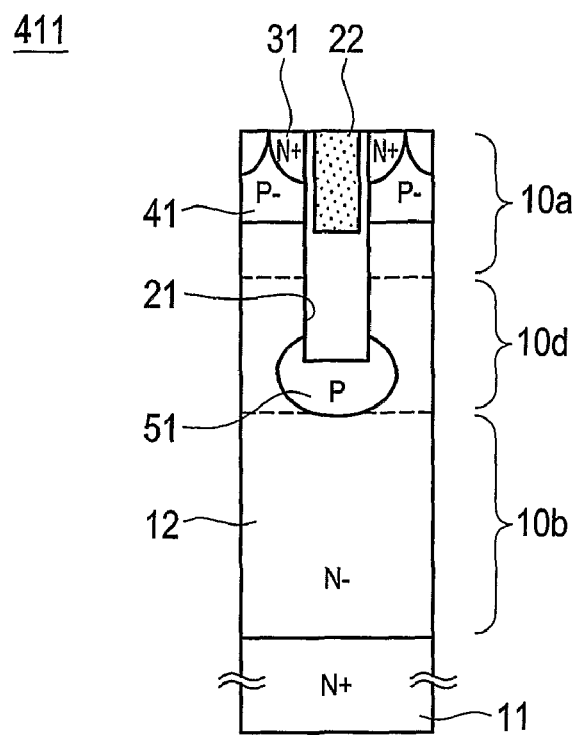
FIG. 20 is a sectional view showing an application 1 (No. 2) of the insulated gate-type semiconductor device according to the fourth embodiment.
Figure 21:
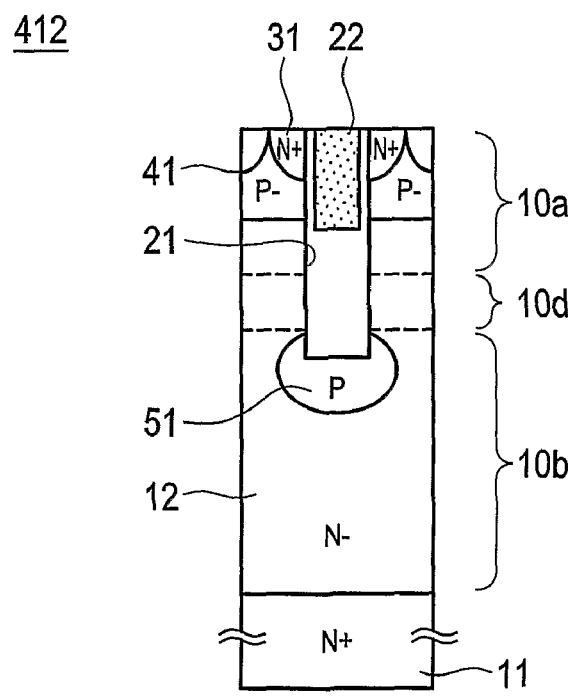
FIG. 21 is a sectional view showing an application 1 (No. 3) of the insulated gate-type semiconductor device according to the fourth embodiment.

In the semiconductor device 410, the position where the concentration in the epitaxial layer 10 starts to changes, i.e. a boundary between the concentration layer 10b and the intermediate layer 10d, is between the lower end of the P diffusion region 51 and the upper end of the P diffusion region 51. FIG. 20 shows a semiconductor device 411 in which the change in specific resistance of the epitaxial layer 10 starts from the vicinity of the lower end of the P diffusion region 51. FIG. 21 shows a semiconductor device 412 in which the change in specific resistance of the epitaxial layer 10 starts from the vicinity of the upper end of the P diffusion region 51.

With the semiconductor device 410, the intermediate layer 10d whose concentration gently changes is provided between the high concentration region and the low concentration region. This intermediate layer 10d surrounds the upper end of the P diffusion layer 51. This permits the upper depletion layer to be more reliably connected with the P diffusion region 51 than with the case of the semiconductor device 400. Hence, a lowering of withstand voltage is suppressed.

It will be noted that if the lower face of the intermediate layer 10d is lower than the lower end of the P diffusion region 51, the depletion layer is likely to spread longitudinally. More particularly, the lower depletion layer spreads widely, thereby worsening the on-resistance characteristic upon switching. On the other hand, if the lower face of the intermediate layer 10d is higher than the upper end of the P diffusion region 51, the upper depletion layer is unlikely to spread. In other words, there is concern that the upper depletion layer does not arrive at the P diffusion region 51, thereby lowering a withstand voltage. Accordingly, it is preferred that the lower face of the intermediate layer 10d is set within such a range as set out above.

Figure 26:
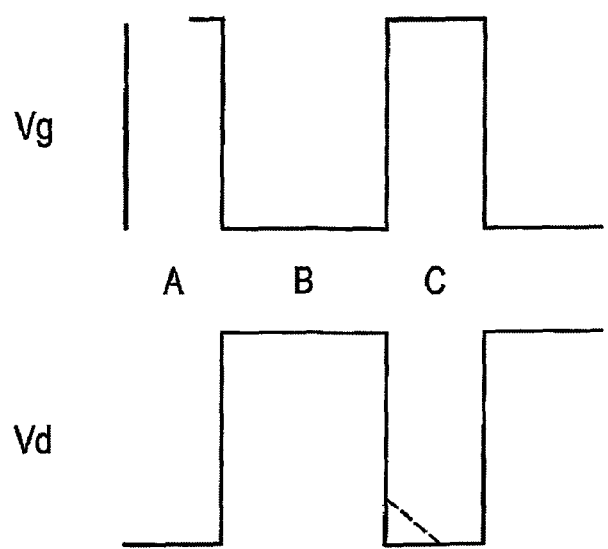
FIG. 26 is a timing chart showing an instance of switching of a semiconductor device.

Subsequently, the results of simulation of the semiconductor device in which the respective layers of the epitaxial layer differ from one another with respect to the concentration thereof are illustrated. The specification of a tested semiconductor device is shown in FIG. 22. This simulation is for a semiconductor device in which a withstand voltage between the drain and source is at 70 V, and an increasing rate of an on-resistance in case where a power supply voltage is set at 60V was checked. It will be noted that a resistance increasing rate used in this simulation is a value indicating how an on-resistance increases immediately after spreading of a depletion layer (point C) when compared with an on-resistance at the time when no depletion layer spreads (point A in FIG. 26).

Figure 24:
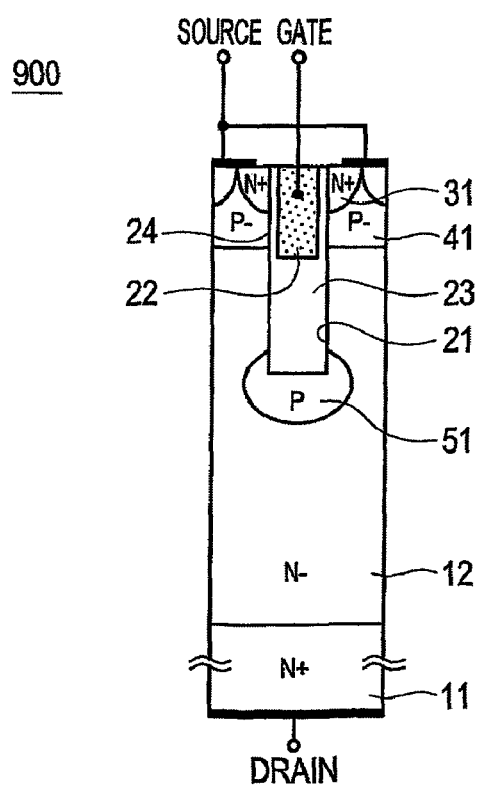
FIG. 24 is a sectional view showing a structure of a conventional insulated gate-type semiconductor device.
Figure 25:
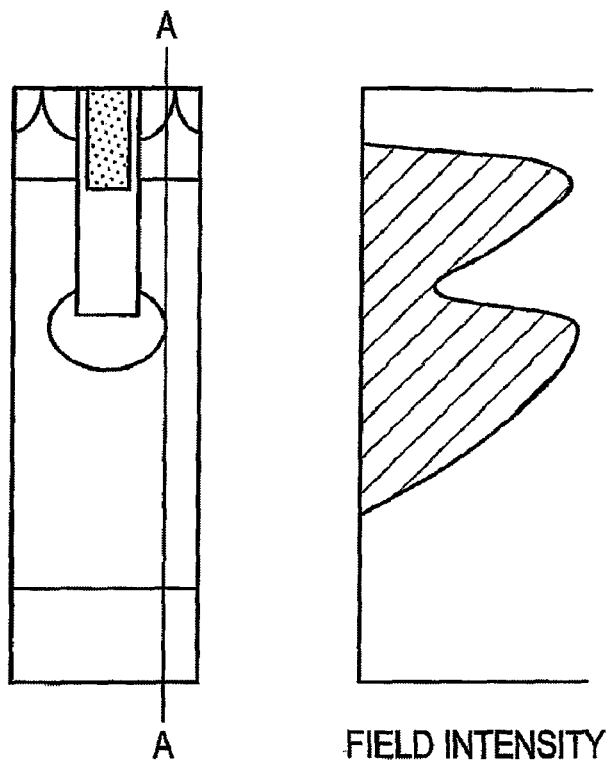
FIG. 25 is a view showing a field intensity of a conventional insulated gate-type semiconductor device.

In FIG. 22, a single-layered structure means a conventional semiconductor device (FIG. 24). The concentration of the epitaxial layer is set at $2.0 \times 10^{16}/cm^3$. In this simulation, the resistance increasing rate of the single-layered structure was at 120%.

On the other hand, double-layered and three-layered structures in FIG. 22 mean a semiconductor device 401 (FIG. 18) and a semiconductor device 410 (FIG. 19), respectively. The concentration distribution of the epitaxial layer is just as shown in FIG. 22. More particularly, layers whose concentrations are higher and lower than a standard concentration are provided, respectively. Moreover, with a semiconductor device having a three-layered structure, a layer whose concentration gradually changes is provided between the high concentration layer and the low concentration layer. In this simulation, a resistance increasing rate of the double-layered structure is at 50%, and a resistance increasing rate of the three-layered structure is at 40%. That is, it has been found that at the time of switching operation, an increase in on-resistance significantly decreases for both semiconductor devices.

Application 2 of the Fourth Embodiment

Figure 23:
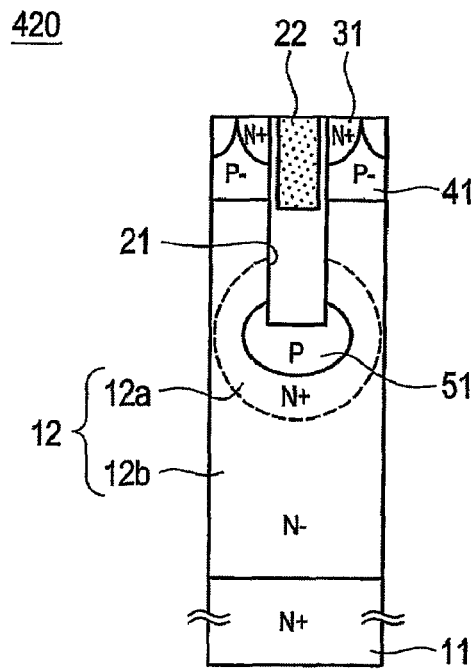
FIG. 23 is a sectional view showing an application 2 of the insulated gate-type semiconductor device according to the fourth embodiment.

Application 2 of this embodiment is shown in FIG. 23. A semiconductor device 420 according to Application 2 is so arranged that an impurity concentration is increased at part of the $N^-$ drift region 12, particularly, around the P diffusion region 51, and is made lower at the other regions. This differs from the semiconductor device 400 having a layer in which the specific resistance (concentration) of the epitaxial layer differs longitudinally.

More particularly, the $N^-$ drift region 12 of the semiconductor device 420 includes an $N^+$ high concentration region 12a of high concentration surrounding the P diffusion region 51 and an $N^{--}$ low concentration region 12b surrounding the $N^+$ high concentration region 12a. The $N^+$ high concentration region 12a surrounding the P diffusion region 51 is higher in concentration than the $N^{--}$ low concentration region 12b. Accordingly, the spreading of a depletion layer is small in degree when the gate voltage Vg is off. As a result, if holes are not supplied to the P diffusion region upon switching, a drift current is not impeded because the depletion layer does not originally spread widely. That is, a good on-resistance characteristic is obtained according to a mechanism similar to the semiconductor device 400.

The semiconductor device 420 of this embodiment can be manufactured substantially in the same manner as the conventional semiconductor device 900. More particularly, the difference between the manufacturing method of the semiconductor device 400 and the manufacturing method of the semiconductor device 900 resides only in that an epitaxial layer that becomes the $N^{--}$ low concentration region 12b is formed, the $N^+$ high concentration region 12a is formed by ion implantation from the bottom of the trench and annealing, and the P diffusion region 51 is formed. In comparison with the semiconductor device 400 and semiconductor device 410 where plural epitaxial layers are formed, the semiconductor device 420 of this Application 2 is easy to manufacture because the epitaxial layer is made of a single layer.

As having stated in detail, the semiconductor device 400 of the fourth embodiment has the trench gate structure building the gate electrode 22 within the gate trench 21. With the semiconductor device 400, the P diffusion region 51 in a floating state is disposed inside the $N^-$ drift region 12, thereby providing a floating structure. Moreover, the epitaxial layer in which the $N^-$ drift region 12 is formed has the low concentration layer 10a positioned at the surface side and the high concentration layer 10b positioned below the low concentration layer 10a and surrounding the P diffusion region 51.

Accordingly, with the semiconductor device 400, when the gate voltage Vg is off, a depletion layer spreading below the P diffusion region 51 spreads slightly. Eventually, when the gate voltage Vg is on, a drift current is not impeded because of the depletion layer not originally spreading over a wide range. Hence, a good on-resistance characteristic is obtained.

Furthermore, with the semiconductor device 400, the provision of the low concentration layer 10a above the high concentration layer 10b contributes to suppressing a field peak value from increasing, thereby permitting a withstand voltage to be ensured mainly by means of the upper depletion layer. Thus, a lowering of withstand voltage is suppressed. In this way, there is realized an insulated gate-type semiconductor device that is high in withstand voltage and exhibits a good on-resistance characteristic at the time of AC operation.

It should be noted that the embodiments are only by way of illustration and should not be construed as limiting the invention thereto. Accordingly, many modifications and alterations may be possible without departing from the spirit of the invention. For instance, the P type and N type of the respective semiconductor regions may be interchanged. With the gate insulating film 24, aside from an oxide film, other types of insulating films such as a nitride film may be used, or a composite film may be used. As to the semiconductor, limitation is not placed on silicon, and other types of semiconductors (SiC, GaN, GaAS and the like) maybe used. The insulated gate-type semiconductor device of the embodiments may be applicable to conductivity modulation-type power MOS using a p-type substrate.

INDUSTRIAL APPLICABILITY

According to the insulated gate-type semiconductor device of the invention, holes are supplied to a buried diffusion region by means of a low concentration diffusion region. According to another type of insulated gate-type semiconductor device of the invention, a range of a depletion layer spreading below a floating diffusion region is narrowed, and a withstand voltage is ensured with a depletion layer spreading mainly from a body region to a floating diffusion region. Accordingly, there are realized an insulated gate-type semiconductor device, which is high in withstand voltage and exhibits a good on-resistance characteristic at the time of AC operation, and a manufacturing method thereof.

The invention claimed is:

1. An insulated gate-type semiconductor device having a body region which is located at an upper surface side within a semiconductor substrate and is a semiconductor of a first conductive type, and a drift region which is in contact with a lower face of the body region and is a semiconductor of a second conductive type, comprising:
   a trench passing from an upper surface of the semiconductor substrate through the body region;
   a gate insulating film positioned at a side wall of the trench;
   a gate electrode located inside the trench facing to the body region through the gate insulating film;
   a buried diffusion region which is positioned below the gate electrode, is surrounded with the drift region and surrounds a bottom of the trench therewith, and is a semiconductor of the first conductive type; and
   a low concentration diffusion region which is in juncture with the body region and the buried diffusion region, is lower in concentration than the buried diffusion region, and is a semiconductor of the first conductive type.

2. The insulated gate-type semiconductor device according to claim 1, wherein the low concentration region is depleted at least a part thereof in a direction of thickness prior to the buried diffusion region when a gate voltage is off.

3. The insulated gate-type semiconductor device according to claim 1, wherein the low concentration diffusion region has a RESURF structure.

4. The insulated gate-type semiconductor device according to claim 1, wherein the low concentration diffusion region is in contact with a side face at an end portion of the trench in a lengthwise direction as viewed from above.

5. The insulated gate-type semiconductor device according to claim 1, wherein the buried diffusion region is formed in a longitudinal direction of depth of a trench as viewed from a section intersecting at right angles with the lengthwise direction as viewed from above the trench.

6. The insulated gate-type semiconductor device according to claim 1, wherein the buried diffusion region is disposed at a position which enables a field peak to be formed respectively at two portions including a PN junction between the body region and the drift region and a PN junction between the buried diffusion region and the drift region.

7. The insulated gate-type semiconductor device according to claim 1, wherein the low concentration diffusion region is in contact with one of side faces of the trench as viewed from a section intersecting at right angles with the lengthwise direction as viewed from above the trench.

8. The insulated gate-type semiconductor device according to claim 7, wherein an epitaxial layer at a region of a connected portion between the low concentration diffusion region and the body region has a concentration higher than other regions of the epitaxial layer.

9. The insulated gate-type semiconductor device according to claim 1, wherein the trench has such a layout as to be divided into a plurality of sub-trenches in a lengthwise direction as viewed from above, and the low concentration diffusion region is in contact with individual end portions of the sub-trenches.

10. The insulated gate-type semiconductor device according to claim 9, wherein positions of the end portions of the sub-trenches in the lengthwise direction as viewed from above differ from each other with respect to adjacent trenches.

11. The insulated gate-type semiconductor device according to claim 9, wherein positions of the end portions of the sub-trenches in the lengthwise direction as viewed from above are in line with respect to adjacent trenches.

12. The insulated gate-type semiconductor device according to claim 11, further comprising:
   a second trench which extends in directions intersecting at right angles with the lengthwise direction as viewed from above the trench and is positioned between the end portions of adjacent sub-trenches; and
   an intermediate buried diffusion region which is surrounded with the drift region and surrounds a bottom of the second trench therewith, and is a semiconductor of the first conductive type.

* * * * *

UNITED STATES PATENT AND TRADEMARK OFFICE
CERTIFICATE OF CORRECTION

| | |
|---|---|
| PATENT NO. | : 7,999,312 B2 |
| APPLICATION NO. | : 12/223871 |
| DATED | : August 16, 2011 |
| INVENTOR(S) | : Hidefumi Takaya et al. |

It is certified that error appears in the above-identified patent and that said Letters Patent is hereby corrected as shown below:

| Column | Line | |
|---|---|---|
| 10 | 19 | Change first line of TABLE 1 to read as follows: |

--Width of $P^-$ diffusion region   Concentration of $P^-$ diffusion region--.

Signed and Sealed this
Twenty-first Day of February, 2012

David J. Kappos
*Director of the United States Patent and Trademark Office*